(12) United States Patent
Müller

(10) Patent No.: US 11,049,541 B2
(45) Date of Patent: Jun. 29, 2021

(54) MEMORY CELL ARRANGEMENT AND METHODS THEREOF

(71) Applicant: Ferroelectric Memory GmbH, Dresden (DE)

(72) Inventor: Stefan Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/989,494

(22) Filed: Aug. 10, 2020

(65) Prior Publication Data

US 2021/0125656 A1 Apr. 29, 2021

(30) Foreign Application Priority Data

Oct. 24, 2019 (DE) .................. 10 2019 128 732.4

(51) Int. Cl.
 *G11C 11/22* (2006.01)
(52) U.S. Cl.
 CPC ...... *G11C 11/2275* (2013.01); *G11C 11/2293* (2013.01); *G11C 11/2297* (2013.01)
(58) Field of Classification Search
 CPC ..... G11C 11/22; G11C 11/223; G11C 11/221; G11C 11/2275
 See application file for complete search history.

(56) References Cited

U.S. PATENT DOCUMENTS

| 2003/0142533 | A1 | 7/2003 | Ueda et al. |
| 2012/0176829 | A1 | 7/2012 | Kang et al. |
| 2014/0268483 | A1* | 9/2014 | Khan ............. G11C 11/22 361/301.1 |
| 2019/0287599 | A1* | 9/2019 | Higashi ........ H01L 27/11592 |

* cited by examiner

*Primary Examiner* — Han Yang
(74) *Attorney, Agent, or Firm* — Hickman Becker Bingham Ledesma LLP; Malgorzata A. Kulczycka

(57) ABSTRACT

A memory cell arrangement is provided that may include: a control circuit configured to supply a precondition signal and one of at least two write signals to a memory cell of the memory cell arrangement, the memory cell including a field-effect transistor structure and a remanent-polarizable layer, wherein the precondition signal is configured to bring the memory cell from an actual condition into a predefined condition, wherein the predefined condition is associated with a predefined threshold voltage of the field-effect transistor structure of the memory cell, and wherein the at least two write signals are configured to write the memory cell selectively into a first memory state or into a second memory state.

20 Claims, 13 Drawing Sheets t0 t1 t2 t3

MEMORY CELL ARRANGEMENT AND METHODS THEREOF

CROSS-REFERENCE TO RELATED APPLICATION

The application claims the benefit of German Patent Application No. 10 2019 128 732.4 filed Oct. 24, 2019, which is incorporated by reference herein in its entirety.

TECHNICAL FIELD

Various aspects relate to a memory cell arrangement, and methods thereof, e.g. a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for writing (e.g., programming and/or erasing) and/or reading the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
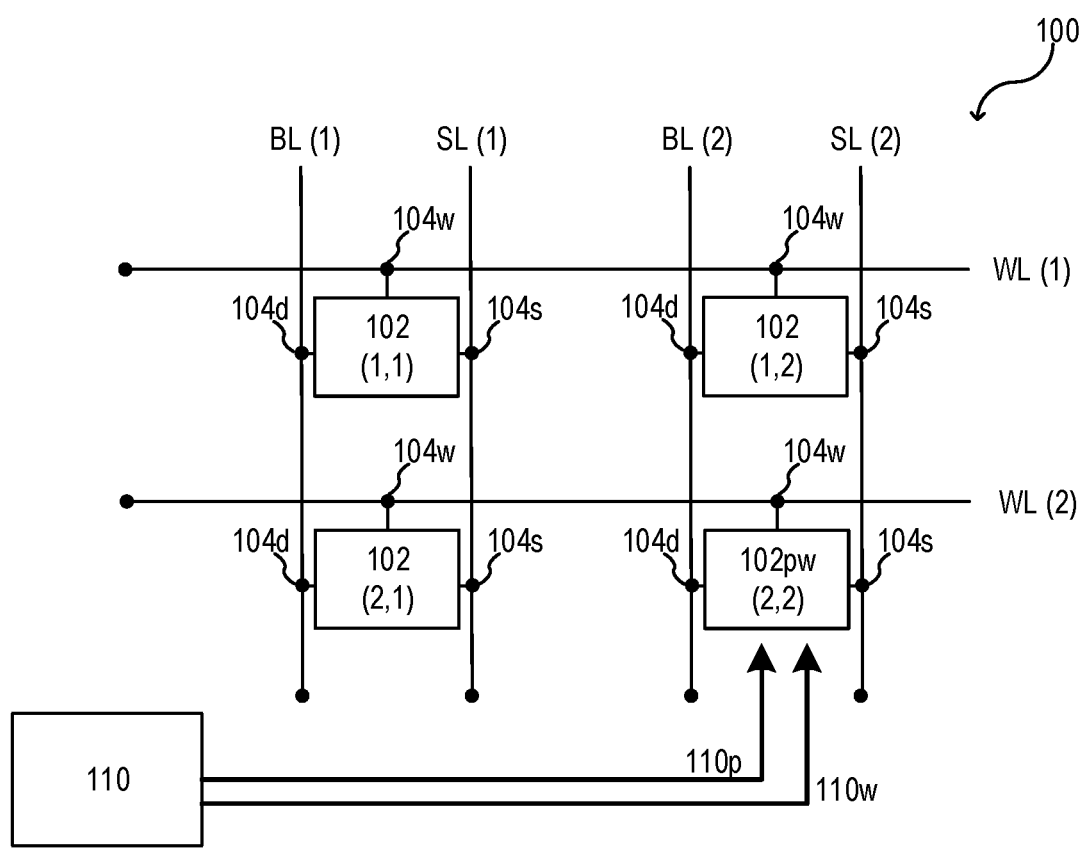
FIG. 1A schematically shows a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g. a memory cell, or a memory cell arrangement). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g.

provided by a metal or degenerate semiconductor in absence of p-n junctions in the current path. The term "electrically conductively connected" may be also referred to as "galvanically connected".

The term "voltage" may be used herein with respect to "one or more write voltages", "one or more precondition voltages", "one or more readout voltages", "one or more gate voltages", "a base voltage", "one or more source/drain voltages", "one or more word-line voltages", and the like. As an example, the term "gate voltage" may be used herein to denote a voltage that is provided to a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided to a source/drain node or a source/drain terminal of a transistor or a memory cell, as examples. As another example, the term "control-line voltage" may be used herein to denote a voltage that is provided to a control-line, e.g., of a memory cell arrangement (for example a "word-line voltage" may be provided to a "word-line", a "bit-line voltage" may be provided to a bit-line, and a "source-line voltage" may be provided to a source-line).

Illustratively, a voltage provided to a node may assume any suitable value depending on the intended operation of the circuit including the node. For example, a gate voltage (referred to as $V_G$) may be varied depending on the intended operation of a transistor or a memory cell. Analogously, a source voltage (referred to as $V_S$) and/or a drain voltage (referred to as $V_D$) may be varied depending on the intended operation of a transistor or a memory cell. A voltage provided to a node may be defined by the respective potential applied to that node relative to the base voltage (referred to as $V_B$) of the circuit. Further, a voltage drop associated with two distinct nodes of a circuit may be defined by the respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field effect transistor based memory cell, the gate-source voltage drop and the gate-source voltage, $V_{GS}$, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) are considered for the comparison. As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 µA. In some aspects, the constant-current threshold voltage, $V_{th(ci)}$, may be determined based on the following equation:

$$V_{th(ci)} = V_{GS} (\text{at } I_D = I_{D0} \cdot W/L)$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g. intrinsic) property of the field-effect transistor or of the field-effect transistor based memory cell.

According to various aspects, a memory cell may have at least two distinct states associated therewith, for example with two distinct electrical conductivities that can be determined to determine in which of the at least two distinct states the memory cell is residing in. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g. associated with a logic "1") and the high threshold voltage state may be an electrically non-conducting state or at least less conducting than the low threshold voltage state (e.g. associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g., associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable layer. For example, a polarization of a remanent-polarizable layer may be switched, such that the sign of the polarization varies from positive to negative or from negative to positive, while the absolute value of the polarization may remain in some aspects substantially unaltered.

The term "shift" may be used herein to describe a change of a property of a memory cell or of a remanent-polarizable layer, such as a threshold voltage, a memory window, a coercive field, a polarization, a residual polarization, and the like. For example, a coercive field of a remanent-polarizable layer may be shifted, such that after the shift a value of the coercive field may be higher or lower than the value of the coercive field before the shift. Similarly, a threshold voltage of a memory cell may be shifted, such that after the shift a value of the threshold voltage may be higher or lower than the value of the threshold voltage before the shift.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor (FET) structure having a ferroelectric material as a gate insulator.

As another example, a memory cell may include a field-effect transistor structure and a ferroelectric capacitor structure coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. According to various aspects, a FeFET or a FeFET based memory cell may be considered as a field-effect transistor based memory cell that stores data by means of a ferroelectric material in the gate stack. According to various aspects, a non-volatile field-effect transistor based memory structure or memory cell may store data for a period of time from hours (e.g. more than 5 hours) to several tens of years (e.g. 10 years, 20 years, etc.), whereas a volatile field-effect transistor based memory structure or memory cell may store data for a period of time from nanoseconds to hours (e.g. less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include, for example, a single FeFET structure or a plurality of (e.g., two) FeFET structures. This may allow for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET based memory cells on a CMOS process platform may be carried out in a gate-first process technology. However, FeFET based memory cells may be implemented into other process technologies, wherein different integration schemes may be used. The FeFET based memory cells may be integrated, for example, next to one or more logic circuit structures, e.g., next to one or more processor cores on a chip. However, the FeFET based memory cells may be integrated independently from other structures. According to various aspects, a FeFET memory cell or a FeFET based memory cell may be provided with a feature size equal to or less than about 45 nm.

According to various aspects, a ferroelectric material may be used as part of a memory cell. The term "ferroelectric" may be used herein, for example, to describe a material that shows a hysteretic charge voltage relationship (QV). The ferroelectric material may be or may include ferroelectric hafnium oxide ($HfO_2$). Ferroelectric $HfO_2$ may include any form of hafnium oxide that may exhibit ferroelectric properties. This may include, for example, $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable layer. According to various aspects, a ferroelectric layer may be an example of a remanent-polarizable layer.

Various aspects may be related to a remanently-polarizable layer (also referred to as remanent-polarizable layer) as memory layer or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, the terms "spontaneously polarized" or "spontaneous polarization" may be used herein, for example, with reference to the polarization capability of a material beyond dielectric polarization. The coercivity of a material may be a measure of the strength of the reverse polarizing electric field that may be required to remove a remanent polarization. According to various aspects, an electric coercive field, $E_C$, (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The term "condition" may be used herein to include, for example, one or more properties, e.g. of a memory cell. As an example, a memory cell may be in a first condition and may have a first set of properties (e.g., a first value for the low and/or high threshold voltage, a first QV characteristic, and the like) associated therewith, and a memory cell may be in a second condition and may have a second set of properties (e.g., a second value for the low and/or high threshold voltage, a second QV characteristic, and the like) associated therewith. In this case, at least one property of the second set of properties may be different from that property in the first set of properties.

The term "predefined" may be used herein in relation to a condition or to one or more properties, e.g. of a memory cell, to include, for example, a desired condition or a desired value for a particular property. As an example, a predefined condition of a memory cell may be a condition in which the memory cell may provide better performances (e.g., in terms of failures associated with the operation of the memory cell) with respect to a non-predefined condition of the memory cell. Illustratively, an operation of the memory cells of a memory cell arrangement may be designed based on assumed predefined conditions for the memory cells. As another example, a memory cell having a predefined property or a predefined value of a particular property (e.g., a predefined threshold voltage or a predefined value of a threshold voltage, or the like) may provide better performances with respect to a memory cell having a non-predefined property or a non-predefined value of a particular property. A predefined condition may also be referred to as an initial (e.g., pristine or non-degraded) condition. A predefined property or a predefined value may also be referred to as initial property or initial value. It is understood that a memory cell, for example, may have more than one predefined conditions. For example, a memory cell may have more than one conditions that ensure in a same or similar manner better performances with respect to other non-predefined conditions.

The term "actual" may be used herein in relation to a condition or to one or more properties (e.g., of a memory cell) to include, for example, an instantaneous condition and/or an instantaneous property (e.g., an instantaneous value of a property). As an example, the term "actual" may be used to describe a condition and/or a property at a particular time point. An actual condition (also referred to as instant condition) may be different from a predefined condition or it may be equal to a predefined condition. An actual property and/or an actual value of a property may be different from a predefined property and/or from a predefined value of a property or it may be equal to the predefined property and/or to a predefined value of the property. Illustratively, this may be similar to an actual value and a reference value (e.g., set-point value) of a controlled variable in a system (e.g., in a feedback loop), wherein the actual value may be the value of the controlled variable at a given time point and the reference value may be a set (predefined) value the variable is supposed to have.

In some aspects, a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages. The write voltage of such a writing scheme or any other suitable writing scheme may be part of a conditioned write scheme that includes at least one precondition signal in addition to the actual write voltage.

In general, a memory cell arrangement may include a plurality of (e.g., volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g., to one or more word-lines, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a bit-line and a source-line. For example, groups of memory cells in a NAND architecture may be connected in series with one another. In a NOR architecture the memory cells may be connected in parallel with one another, for example each memory cell of a column may be connected to a different source-line and may share the same bit-line with the one or more other memory cells in the same column. A NAND architecture may thus be more suited for serial access to data stored in the memory cells, whereas a NOR architecture may be more suited for random access to data stored in the memory cells.

A possible issue may be that during a storage period (also referred to as retention period) the memory state a memory cell is residing in may become favored (e.g., preferred or more energetically stable) with respect to any other possible memory state of the memory cell. A storage period may be, for example, a period of time during which a memory state a memory cell is residing in is not switched (e.g., a period between two write operations). The memory characteristics may be still valid for the specific memory state that has become favored; however, a switch of the memory state and a subsequent readout may be prone to errors in the case that a conventional write scheme would be used. For example, this phenomenon may be referred to as imprint or imprint effect. According to various aspects, an imprinted memory cell may be a memory cell having an imprinted condition, wherein the imprinted condition may be a non-predefined condition. Illustratively, a memory cell in an imprinted condition may have a memory state favored over any other memory state the memory cell could reside in. For a field-effect transistor based memory cell including a remanent-polarizable layer the imprint effect may be caused by the used remanent-polarizable material being polarized into one direction and stored in this state. The polarization state may thus become favored during the retention period. The imprint effect may lead to a shift in the coercive fields and/or residual polarizations of the remanent-polarizable layer. This may also lead to fails during readout since, for example, the imprinted memory cell may not store properly a newly written memory state.

According to various aspects, the imprint related effects may be temperature dependent. Illustratively, the time it takes a remanent polarizable layer to reach an imprinted condition may decrease for increasing temperature (e.g., for an increasing temperature of the memory cell or of the environment surrounding the memory cell, for example a temperature the memory cell reaches during operation). As an example, at room temperature (e.g., 25° C.) a memory cell may become an imprinted memory cell after more than one day, for example more than one week. As another example, at a temperature of about 85° C. a memory cell may become an imprinted memory cell after a few hours, for example after 2 hours, for example after 5 hours. As a yet further example, at a temperature of about 300° C. a memory cell may become an imprinted memory cell after a few minutes, for example after 10 min, for example after 30 min, or after 1 hour.

Various aspects are related to a memory cell arrangement including one or more memory cells. The one or more memory cells may be, for example, one or more FET based memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). In some aspects, a control circuit may be used to control a writing of all the memory cells in a same row of memory cells (e.g., all memory cells having a node connected to a common word-line). According to various aspects, writing a memory cell may include bringing the memory cell from one of at least two memory states into another one of the at least two memory states of the memory cell (e.g., from the LVT state into the HVT state, or vice versa).

Various aspects are related to a control circuit that is configured to efficiently carry out writing operations based on a conditioned writing scheme. The conditioned writing scheme may illustratively include providing various voltages to the memory cell(s) intended to be written in such a way that any imprint related effects or any effects that have occurred during a storage period (e.g., a variation of the charge stored in a floating gate, a variation in the resistance of a phase change material, a variation of the residual polarization in a remanent-polarizable layer, etc.) may be substantially removed before the memory cell(s) is/are written, e.g. before the memory cell(s) are brought into a new memory state. In various aspects, the conditioned writing scheme may include providing various voltages to the memory cell(s) intended to be written in such a way that a predefined condition of the memory cell(s) is restored before the memory cell(s) is/are written and/or that the memory cell(s) is/are brought into a predefined condition during writing. A predefined condition may be associated with one or more memory states associated with a memory cell. According to various aspects, a predefined condition may be a condition in which no memory state of the memory cell is favored (e.g., all the possible memory states of the memory cell may be substantially equally stable).

According to various aspects, a conditioned writing scheme for writing one or more memory cells may include supplying a precondition signal and a write signal to one or more memory cells (illustratively, to one or more memory cells intended to be written). The precondition signal may be configured such that by means of the precondition signal an imprint or, in general, any effects that may have occurred during a storage period may be at least substantially removed from the one or more memory cells. In some aspects, the precondition signal may be configured to restore a predefined condition of the one or more memory cells, for example to bring the one or more memory cells from an actual condition into the respective predefined condition (illustratively, before the one or more memory cells are actually written or after the one or more memory cells are actually written). In some aspects, the precondition signal may be configured such that a respective predefined condition of the one or more memory cells is restored during the writing of the one or more memory cells. The write signal may be configured such that the one or more memory cells may be written by means of the write signal.

According to various aspects, a memory cell arrangement may include a control circuit configured to supply a precondition signal and a write signal to a memory cell of the memory cell arrangement. The precondition signal may be configured to bring the memory cell from an actual condition into a predefined condition. The write signal may be configured to write the memory cell. Illustratively, the memory cell arrangement may include one or more memory cells, wherein at least one memory cell of the memory cell arrangement is intended to be preconditioned and written by application of the precondition signal and the write signal. In some aspects, a single memory cell of the memory cell arrangement may be preconditioned and written by application of a precondition signal and a write signal. In some other aspects, a plurality of memory cells of the memory cell arrangement may be preconditioned and written (illustratively at the same time) by application of a common precondition signal and a common write signal.

According to various aspects, the write signal may be supplied after the precondition signal has been applied, for example in a common write operation. According to other aspects, the precondition signal may be supplied to one or more memory cells (e.g., to all the memory cells of the memory cell arrangement) at predetermined (e.g., periodic) time intervals during a storage period (for example every hour, every 6 hours, every 12 hours, every 24 hours, etc.). In this case, it may not be necessary to supply a write signal in addition to the preconditioning. However, the preconditioning may ensure that the memory cells are (e.g., periodically) brought into the respective predefined condition. The precondition signal may be configured such that the memory state the one or more memory cells is/are residing in is not switched during or after the precondition signal has been applied to the one or more memory cells. As an example, a duration and/or an amplitude of the precondition signal may be chosen such that the memory state the one or more memory cells is/are residing in is not switched by the precondition signal. For supplying the precondition signal at predetermined time intervals it may be beneficial to know or to determine the memory state the one or more memory cells is/are residing in for configuring the precondition signal, as it will be explained in further detail below. In this case, the writing of the one or more memory cells may be performed by application of the write signal accordingly, for example independent of the application of the precondition signal before.

FIG. 1A illustrates schematically an exemplary configuration of a memory cell arrangement 100, according to various aspects. The memory cell arrangement 100 may include one or more memory cells 102. The memory cells 102 may be arranged, for example, in a matrix architecture. The memory cells 102 may be arranged in a number, n, of columns and in a number, m, of rows, with m and n integer numbers greater than 1. FIG. 1A illustrates two columns (e.g., a first column and a second column) and two rows (e.g., a first row and a second row) of a memory cell arrangement 100 including two memory cells 102 each, only as an example. The memory cell arrangement 100 may include any suitable number of memory cells 102, arranged in any suitable number, n, of columns and in any suitable number, m, of rows.

According to various aspects, each memory cell 102 of the one or more memory cells 102 may include one or more control nodes. As an example, each memory cell 102 may include at least a second control node 104$s$, a third control node 104$d$, and a first control node 104$w$ to control an electrical behavior of the second control node 104$s$ and the third control node 104$d$ of the memory cell 102 (e.g., a current flow between the second control node 104$s$ and the third control node 104$d$). According to various aspects, each memory cell 102 of the one or more memory cells 102 may be a field-effect transistor (FET) based memory cell, and may include two source/drain regions and a gate region (also referred to as gate structure) to control a current flow between the two source/drain region. In various aspects, each of the one or more memory cells 102 may include a field-effect transistor structure. As an example, each memory cell 102 may include a gate node 104$w$, a source node 104$s$, and a drain node 104$d$. The gate node 104$w$ may be coupled to the gate region of the memory cell 102. The source node 104$s$ may be coupled to the source region of the memory cell 102. The drain node 104$d$ may be coupled to the drain region of the memory cell 102.

According to various aspects, the memory cell arrangement 100 may include a plurality of control-lines (e.g., one or more word-lines, WL, one or more bit-lines, BL, and one or more source-lines, SL), coupled to the memory cells 102. The control-lines may be used to supply voltages to control nodes of the memory cells 102. The plurality of control-lines may be arranged in any suitable way defined by the desired matrix architecture of the memory cell arrangement 100.

As an example, the gate node 104$w$ of each memory cell 102 may be connected to a corresponding word-line, WL, the source node 104$s$ of each memory cell 102 may be connected to a corresponding source-line, SL, and the drain node 104$d$ of each memory cell 102 may be connected to a corresponding bit-line, BL. Illustratively, each memory cell 102 may be unambiguously assigned to one word-line, WL, to one source-line, SL, and to one bit-line, BL (e.g. to a source/bit-line pair including the respective source-line, SL, and the respective bit-line, BL). According to various aspects, the memory cell arrangement 100 may include a set of source-lines, (e.g., a first source-line, SL(1), and a second source-line, SL(2), as an example), and a set of bit-lines (e.g., a first bit-line, BL(1), and a second bit-line, BL(2), as an example). Illustratively, the memory cell arrangement 100 may include a set of source/bit-line pairs. The memory cell arrangement 100 may include any suitable number of source-lines, SL, and bit-lines, BL. Each source-line, SL, may be coupled to each memory cell 102 in a same column of memory cells 102. Each bit-line, BL, may be coupled to each memory cell 102 in a same column of memory cells 102. According to various aspects, the memory cell arrangement 100 may include a set of word-lines, (e.g. a first word-line, WL(1), and a second word-line, WL(2), as an example). The memory cell arrangement 100 may include any suitable number of word-lines, WL. Each word-line, WL, may be coupled to each memory cell 102 in a same row of memory cells 102.

According to various aspects, each memory cell 102 may include an additional (e.g., a fourth) control node. In this case, each memory cell 102 may be assigned to an additional (e.g., fourth) control line, for example to an additional word-line, WL. A four terminal memory cell (also referred to as four node memory cell or four terminal device) may be, for example, a ternary memory cell (e.g., a Ternary Content Addressable Memory (TCAM) cell).

According to various aspects, each memory cell 102 may be configured to reside in one of at least two memory states associated with the respective memory cell 102. The memory state a memory cell 102 is residing in may be associated with one of at least two threshold voltages (e.g., a first threshold voltage, $V_{L-th}$, and a second threshold voltage, $V_{H-th}$) of the memory cell 102 (e.g., of a respective field-effect transistor structure of the memory cell 102). According to various aspects, the at least two memory states may include a first memory state (e.g., a LVT state) and a second memory state (e.g., a HVT state). Illustratively, each memory cell 102 may have a first (e.g., low) threshold voltage, $V_{L-th}$, in the first memory state, and a second (e.g., high) threshold voltage, $V_{H-th}$, in the second memory state. The first threshold voltage, $V_{L-th}$, may be different (e.g., lower or higher) from the second threshold voltage, $V_{H-th}$.

According to various aspects, each memory cell 102 of the one or more memory cells 102 may include a remanent-polarizable layer (as an example, each of the one or more memory cells 102 may be a FeFET or a FeFET based memory cell). In this case, the memory state a memory cell 102 is residing in may be associated with one of at least two polarization states of the respective remanent-polarizable layer. The first threshold voltage, $V_{L-th}$, may be associated with a first (e.g., positive) residual polarization of the remanent-polarizable layer (e.g., it may be a function of the first residual polarization). The second threshold voltage, $V_{H-th}$, may be associated with a second (e.g., negative) residual polarization of the remanent-polarizable layer (e.g., it may be a function of the second residual polarization).

The memory states and the threshold voltages of a memory cell will be explained in further detail below, for example in relation to FIG. 2E to FIG. 2H, FIG. 3E to FIG. 3H, and FIG. 4E to FIG. 4H.

In the following, as an exemplary case, the precondition and the writing of one individual memory cell 102*pw*, e.g. the memory cell 102 in position (2,2), is described. It is understood that more than one or all memory cells 102, for example in a same row of memory cells 102, may be written at the same time (e.g., by means of a single write operation).

According to various aspects, the memory cell arrangement 100 may include a control circuit 110. The control circuit may be configured to carry out and/or instruct one or more precondition operations and one or more write operations associated with a writing of the memory cells 102 of the memory cell arrangement 100. The control circuit may be configured to supply one or more precondition signals and one or more write signals to the memory cells 102 (illustratively, to the memory cells intended to be preconditioned and/or written). As an example, the control circuit 110 may include or may control one or more voltage supply circuits. The one or more voltage supply circuits may be used for supplying control voltages (e.g. precondition voltages and write voltages) to the control-lines of the memory cell arrangement 100, e.g. for supplying voltages to the respective control nodes of the one or more memory cells 102. According to various aspects, the control circuit 110 may define a base voltage, $V_B$, e.g. a ground voltage (for example 0 V) associated with the memory cell arrangement 100.

Illustratively, at least one memory cell 102*pw* may be intended to be preconditioned and written. According to various aspects, the control circuit 110 may be configured to supply a precondition signal 110*p* and a write signal 110*w* to the memory cell 102*pw*. In various aspects, the control circuit 110 may be configured to supply the write signal 110*w* to the memory cell 102*pw* after (e.g. less than 1 ms after, less than 10 ms after, less than 100 ms after, etc.) the supplying of the precondition signal 110*p* to the memory cell 102*pw* has terminated. The time between the preconditioning and the writing may not be more than a time after which it may not be guaranteed that the effects of the preconditioning are still present, for example it may not be more than 24 hours.

Illustratively, the control circuit 110 may be configured to carry out a precondition operation to precondition the memory cell 102*pw* for a subsequent write operation of the memory cell 102*pw*. According to various aspects, the precondition operation may include supplying a precondition signal 110*p* to the memory cell 102*pw* and the write operation may include supplying a write signal 110*w* to the memory cell 102*pw*. The write signal 110*w* and/or the precondition signal 110*p* may be supplied to a gate node 104*w* and at least one source node 104*s* or drain node 104*d* of the memory cell 102*pw*. The write signal 110*w* and/or the precondition signal 110*p* may be supplied to a word-line, WL, and to a source/bit-line pair associated with the memory cell 102*pw* (e.g. to the word-line WL(2) and to the source-line SL(2) or the bit-line BL(2) in the exemplary configuration shown in FIG. 1A).

According to various aspects, the precondition signal 110*p* may be configured to bring the memory cell 102*pw* from an actual condition into a predefined condition (illustratively, for writing the memory cell). As an example, the precondition signal 110*p* may be configured such that after the precondition signal 110*p* has been supplied to the memory cell 102*pw*, the memory cell 102*pw* has properties that substantially correspond to predefined properties of the memory cell 102*pw*. This may ensure that the memory cell 102*pw* is capable of storing the memory state written by means of the subsequent write signal 110*w* in a correct manner. The conditioned writing scheme described herein may thus reduce or substantially eliminate read fails.

According to various aspects, the write operation may include supplying the write signal 110*w* to the memory cell 102*pw*. The write signal 110*w* may be configured to write the memory cell 102*pw*. In various aspects, the write signal 110*w* may include a write voltage for bringing the memory cell from the memory state it is residing in into another memory state.

According to various aspects, the predefined condition the memory cell 102*pw* may be brought in before writing may be independent from the memory state the memory cell 102*pw* is residing in before the supplying of the precondition signal 110*p*. The predefined condition the memory cell 102*pw* may be brought in before writing may also be independent from the memory state to be written. According to various aspects, the writing operation may be independent from the predefined condition the memory cell 102*pw* is residing in after the precondition signal 110*p* has been supplied to the memory cell 102*pw*.

According to various aspects, bringing the memory cell 102*pw* from an actual condition into a predefined condition may include bringing the memory cell 102*pw* into a predefined condition (e.g. either a first or a second predefined condition) such that, after writing the memory cell 102*pw* into a second memory state, the memory cell 102*pw* is in a second predefined condition. According to various aspects, bringing the memory cell 102*pw* from an actual condition into a predefined condition may include bringing the memory cell 102*pw* into a predefined condition such that, after writing the memory cell 102*pw* into a first memory state, the memory cell 102pw is in a first predefined condition. Illustratively, the memory cell 102pw memory cell may be in a predefined condition (e.g. the first or the second) before writing, and may be in a predefined condition (e.g. the same as before writing, or another one) after writing.

According to various aspects, the precondition signal 110p and/or the write signal 110w may be adapted (e.g., selected) depending on the intended precondition operation and the intended write operation. According to various aspects, the precondition signal 110p and/or the write signal 110w may be selected depending on the memory state the memory cell 102pw is (or is intended to be) residing in after the write operation (also referred to as the written memory state). The precondition signal 110p and/or the write signal 110w may be selected depending on the intended switch of the memory states associated with the memory cell 102pw (as an example from LVT state to HVT state or vice versa).

According to various aspects, the precondition signal 110p may include a first precondition voltage supplied to the gate node 104w of the memory cell 102pw and a second precondition voltage supplied to one of the source node 104s or drain node 104d of the memory cell 102pw. One of the first precondition voltage or the second precondition voltage may be substantially equal to the base voltage, $V_B$ (e.g. in a range from about −0.25 V to about +0.25 V in the case that the base voltage, $V_B$, is 0 V). In various aspects, the control circuit 110 may be configured such that either the gate node 104w or at least one source/drain node 104s, 104d corresponding to the memory cell 102pw is maintained at the base potential while the precondition signal 110p is supplied to the memory cell 102pw.

According to various aspects, the precondition signal 110p may be understood as any (e.g. constant or time-varying) potential or voltage at the gate node 104w and at least one source/drain node 104s, 104d corresponding to the memory cell 102pw defining a voltage drop over the remanent-polarizable layer of the memory cell 102pw. As an example, the first precondition voltage may be constant and the second precondition voltage may be time-varying (for example, the base voltage, $V_B$, may be time-varying). As another example, both the first precondition voltage and the second precondition voltage may be time-varying.

As an example, in the case that the memory cell 102pw is an n-type FET based memory cell, the precondition signal 110p may be adapted depending on the memory state to be written. In the case that the written memory state is the LVT state, the precondition signal 110p may be configured such that a difference between the first precondition voltage and the second precondition voltage (e.g., a gate-source-voltage, $V_{GS}$) is positive. For example, a positive voltage may be supplied to the word-line associated with the memory cell 102pw (e.g., to the word-line WL(2)), and the base voltage, $V_B$, may be supplied to the source-line associated with the memory cell 102pw (e.g., to the source-line SL(2)). In the case that the written memory state is the HVT state, the precondition signal 110p may be configured such that a difference between the first precondition voltage and the second precondition voltage is negative. For example, a positive voltage may be supplied to the source-line associated with the memory cell 102pw (e.g., to the source-line SL(2)), and the base voltage, $V_B$, may be supplied to the word-line associated with the memory cell 102pw (e.g., to the word-line WL(2)).

As a further example, in the case that the memory cell 102pw is a p-type FET based memory cell, the precondition signal 110p may be configured such that a difference between the first precondition voltage and the second precondition voltage is negative. In the case that the written memory state is the HVT state, the precondition signal 110p may be configured such that a difference between the first precondition voltage and the second precondition voltage is positive.

According to various aspects, the write signal 110w may include a first write voltage supplied to the gate node 104w of the memory cell 102pw and a second write voltage supplied to one of the source node 104s or drain node 104d of the memory cell 102pw. One of the first write voltage or the second write voltage may be substantially equal to the base voltage, $V_B$ (e.g., in a range from about −0.25 V to about +0.25 V in the case that the base voltage, $V_B$, is 0 V). In various aspects, the control circuit 110 may be configured such that either the gate node 104w or at least one source/drain node 104s, 104d corresponding to the memory cell 102pw is maintained at the base potential while the write signal 110w is supplied to the memory cell 102pw.

As an example, in the case that the memory cell 102pw is an n-type FET based memory cell, the write signal 110w may be configured such that a difference between the first write voltage and the second write voltage is negative. In the case that the written memory state is the HVT state, the write signal 110w may be configured such that a difference between the first write voltage and the second write voltage is positive.

As a further example, in the case that the memory cell 102pw is a p-type FET based memory cell, the write signal 110w may be configured such that a difference between the first write voltage and the second write voltage is positive. In the case that the written memory state is the HVT state, the write signal 110w may be configured such that a difference between the first write voltage and the second write voltage is negative.

Figure 1B:
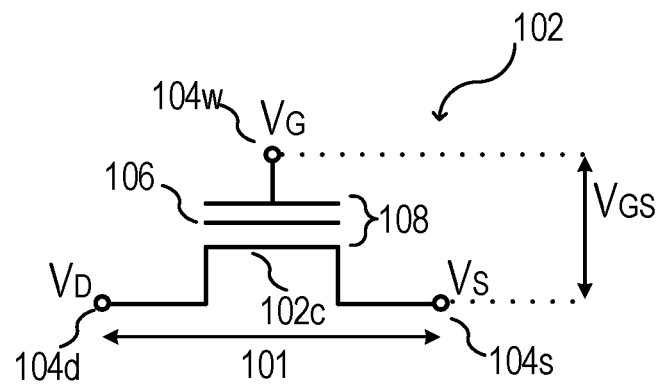
FIG. 1B and FIG. 1C schematically show a memory cell, according to various aspects.
Figure 1C:
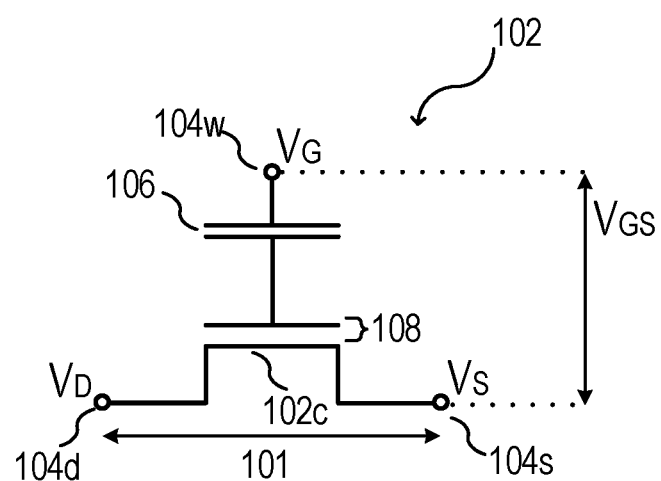

FIG. 1B and FIG. 1C illustrate two exemplary configurations of a memory cell 102 in a schematic view, according to various aspects. The memory cell 102 (e.g., a memory cell 102pw intended to be written) may be a field-effect transistor based memory cell, wherein one or more electronic properties of a field-effect transistor structure (e.g., a conductivity of a channel between two source/drain regions) may be influenced by a memory structure 106 (e.g., by a polarized remanent-polarizable material, a charged layer, a phase change material etc.) of the memory cell 102.

According to various aspects, an electrical current flow 101 between the source node 104s and the drain node 104d may be controlled by controlling the gate voltage, $V_G$, which is applied at the gate node 104w. Illustratively, the gate node 104w may be electrically connected to a gate structure 108 of the memory cell 102, and the gate structure 108 may be configured to allow a variation of the electrical conductivity of a channel formed between the source region and the drain region of the memory cell 102 by applying a voltage thereto.

According to various aspects, the memory cell 102 may include a memory structure 106. The memory structure may be, for example, part of the gate structure 108 (as shown, for example, in FIG. 1B) or connected to the gate structure 108 (as shown, for example, in FIG. 1C). According to various aspects, independently of a configuration of the memory structure 106 with respect to the gate structure 108, a gate-source voltage, $V_{GS}$, of the memory cell 102, for example in a memory cell arrangement 100, may be understood as the difference between the voltage (e.g., the potential) supplied to the word-line, WL, corresponding to the memory cell 102 and the voltage (e.g., the potential) supplied to the source-line, SL, corresponding to the memory cell 102. The memory structure 106 may be configured such that at least one electrical property (e.g., a charge state, a polarization, a conductivity, etc.) of the memory structure 106 can be changed persistently. According to various aspects, the memory structure 106 and the gate structure 108 may be configured to allow for a persistent change of the threshold voltage, $V_{th}$, of the memory cell 102 as a function of the state of the memory structure 106. Accordingly, the memory cell 102 may have at least a first memory state (e.g., the LVT memory state) and a second memory state (e.g., the HVT memory state) defined by the state of the memory structure 106.

As an example, the memory structure 106 may be a floating gate, which may be in a first state when negative charges (electrons) are stored in the floating gate, and may be in a second state when the floating gate is uncharged. When negative charges are stored in the floating gate, a higher gate-source voltage, $V_{GS}$, is required to enable the current flow between the source and drain terminals of the memory cell, as compared to when the floating gate is uncharged. In this case, the memory cell may have a higher threshold voltage. Thus, switching the state of the floating gate from a charged state to an uncharged state, and vice versa, may allow switching the threshold voltage state of the memory cell, and accordingly a logic state associated therewith.

According to various aspects, the memory structure 106 may be a remanent-polarizable layer. The gate node 104w may be connected to at least one of the gate structure 108 and the remanent-polarizable layer 106. The remanent-polarizable layer may have two stable polarization states. According to various aspects, the memory cell may reside in a first memory state in the case that the remanent-polarizable layer is in a first polarization state, and the memory cell may reside in a second memory state in the case that the remanent-polarizable layer is in a second polarization state (e.g., opposite to the first polarization state).

Figure 1D:
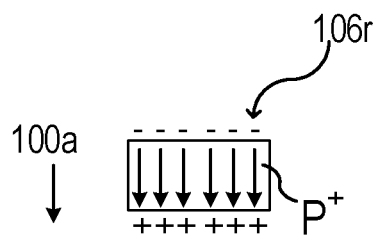
FIG. 1D and FIG. 1E schematically show a polarization within a remanent-polarizable layer, according to various aspects.
Figure 1E:
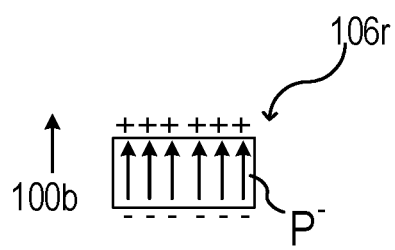

FIG. 1D and FIG. 1E show schematically a remanent-polarizable layer 106r in two exemplary polarization states. The remanent-polarizable layer 106r may be, for example, part of a memory structure 106. The memory structure 106 may be part of a FeFET memory cell, as an example. The respective polarization state may be defined by a residual polarization $P^+$, $P^-$ of the remanent-polarizable layer 106r.

As an example (e.g., for an n-type doped substrate), in a first polarization state, the residual polarization, $P^+$, within the remanent-polarizable layer 106r may be directed in a first direction 100a (see FIG. 1D). The first polarization state may be referred herein to as positive polarization state. In a second polarization state, the residual polarization $P^-$ within the remanent-polarizable layer 106r may be directed in a second direction 100b (see FIG. 1E). The second polarization state may be referred herein to as negative polarization state. The second direction 100b may be opposite with respect to the first direction 100a.

According to various aspects, the residual polarization $P^+$, $P^-$, may cause an aggregation of positive charges (holes, represented by the symbol "+") and negative charges (electrons, represented by the symbol "−") in the surrounding of the remanent-polarizable layer 106r, for example in an electrode or in an underlying stack formed by an insulating layer and a semiconductor substrate. The accumulation of charges may be used to change the conductivity of a channel of a field-effect transistor structure, thus changing the threshold voltage of a memory cell.

According to various aspects, the positive polarization state may be associated with a first (e.g. positive) coercive field, $E_C^+$, which may be or represent the field required to depolarize the remanent-polarizable layer 106r. According to various aspects, the negative polarization state may be associated with a second (e.g. negative) coercive field, $E_C^-$, which may be or represent the field required to depolarize the remanent-polarizable layer 106r.

According to various aspects, the at least two threshold voltages of a memory cell (e.g., of the field effect transistor structure of the memory cell) may be a function of the residual polarization of the remanent-polarizable layer 106r. Switching the state of the remanent-polarizable layer 106r from a first (e.g., positive) polarization state to a second (e.g., negative) polarization state, and vice versa, may thus allow switching the threshold voltage state of the memory cell, and accordingly a logic state associated therewith. According to various aspects, the at least two threshold voltages of a memory cell may be a function of the coercive field of the remanent-polarizable layer 106r.

According to various aspects, a capacitor structure may include the remanent-polarizable layer 106r (e.g., it may be referred to as ferroelectric capacitor "FeCAP", in the case that the remanent-polarizable layer 106r is a ferroelectric layer). For example, the capacitor structure may include the remanent-polarizable layer 106r disposed between a first electrode (e.g., a first conductive layer, such as a first metal layer) and a second electrode (e.g., a second conductive layer, such as a second metal layer). The capacitor structure including the remanent-polarizable layer 106r may be used to implement memory functions, e.g., in a memory cell. Therefore, according to various aspects, the feature and functionalities described herein with reference to a memory cell, e.g., with reference to a FeFET, may be implemented in the same of in a similar way in a capacitor structure, e.g., in a FeCAP, that can act as a memory element.

In various aspects, the polarization state of the remanent-polarizable layer 106r may be switched by means of the capacitor structure. The polarization state of the remanent-polarizable layer 106r may also be read out by means of the capacitor structure. The polarization state of the remanent-polarizable layer 106r may define a memory state, e.g. of a memory cell. As an example, the polarization state of the remanent-polarizable layer 106r may determine the amount of charge stored in the capacitor structure. The amount of charge stored in the capacitor structure may be used to define a memory state (e.g., first amount of charge, for example great than 500 μC (but not limited to such a value), stored in the capacitor structure may define a first memory state, such as a HVT state, and a second amount of charge, for example smaller than 500 μC (but not limited to such a value), stored in the capacitor structure may define a second memory state, such as a LVT state). For example, a memory cell including the capacitor structure including the remanent-polarizable layer 106r may operate without having a field-effect transistor structure included in the memory cell, e.g. without basing the operation on a variation of a threshold voltage of a field-effect transistor structure.

In various aspects, a predefined condition of the capacitor structure including the remanent-polarizable layer 106r may correspond to a predefined polarization state of the remanent-polarizable layer 106r. For example, a predefined condition of the capacitor structure may be defined by a predefined amount of charge stored in the capacitor structure. As an example, a predefined condition of the capacitor structure may be defined by an amount of charge stored in the capacitor structure or a strength of an electric filed generated by the capacitor structure.

In various aspects, writing a memory cell that includes a capacitor structure including a remanent-polarizable layer 106r may include switching the polarization of the remanent-polarizable layer 106r. For example, writing may include changing the amount of charge stored in the capacitor structure.

In the following, the possible effects occurring in a memory cell during a storage period are described, as an exemplary case, in relation to a remanent-polarizable layer of a memory cell. The effects of the conditioned write scheme described herein are thus described, as an exemplary case, in relation to a FET memory cell including a remanent-polarizable layer, for example in relation to restoring the predefined polarization properties of the remanent-polarizable layer of the memory cell. It is understood, that same or similar considerations may apply also to other types of memory cells (e.g., memory cells including a floating gate, memory cells including a phase change material, etc.), in which predefined properties (e.g., a charge, a state of a material, etc.) may change during a retention period, and may be restored in the conditioned write scheme described herein.

FIG. 2A, FIG. 2B, FIG. 2C, and FIG. 2D respectively show a diagram illustrating polarization characteristics of a remanent-polarizable layer. In each graph, the polarization, P, is plotted as a function of an applied electric field, E.

As shown in FIGS. 2A to 2D, a remanent-polarizable layer may exhibit a hysteretic behavior illustrated in form of a measured hysteresis loop 200pe-1, 200pe-2, 200pe-3, 200pe-4. For increasing (positive or negative) applied electric field, E, the polarization, P, of the remanent-polarizable layer may increase accordingly (illustratively, it may become more positive or more negative). When the field, E, is no longer applied (e.g., E=0), the polarization, P, does not vanish, but a residual polarization remains in the remanent-polarizable layer, for example a first (e.g., positive) residual polarization, $P^+$, or a second (e.g., negative) residual polarization, $P^-$, as discussed above in relation, for example, to FIG. 1D and FIG. 1E. The sign of the residual polarization may depend on whether the applied field, E, exceeds a respective threshold value (e.g., a positive coercive field, $E_C^+$, or a negative coercive field, $E_C^-$).

Figure 2A:
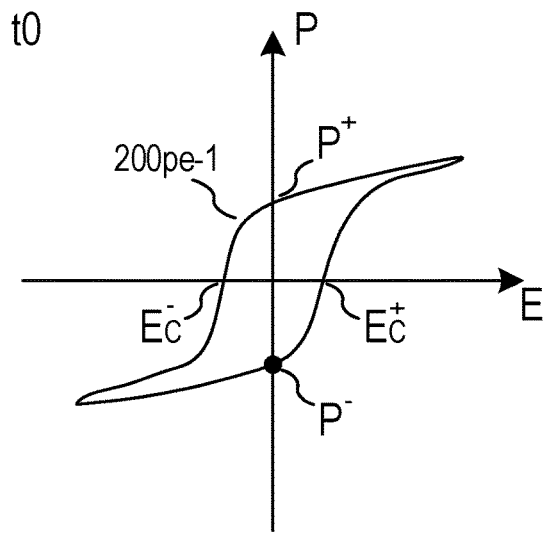
FIG. 2A, FIG. 2B, FIG. 2C, and FIG. 2D show each a polarization characteristic of a remanent-polarizable layer, according to various aspects.

According to various aspects, FIG. 2A illustrates an exemplary predefined condition of a remanent-polarizable layer (e.g., a predefined condition of a memory cell including a remanent-polarizable layer). As an example, a first predefined condition of the remanent-polarizable layer may be a first predefined polarization state (e.g., a condition in which the remanent-polarizable layer has a first predefined residual polarization, e.g., $P^+$). As another example, a second predefined condition may be a second predefined polarization state (e.g., a condition in which the remanent-polarizable layer has a second predefined residual polarization, e.g., $P^-$). According to various aspects, an absolute value of a positive coercive field, $E_C^+$, and/or a positive residual polarization, $P^+$, of the remanent-polarizable layer associated with the first predefined polarization state may be substantially equal to an absolute value of a negative coercive field, $E_C^-$, and/or a negative residual polarization, $P^-$, of the remanent-polarizable layer associated with the second predefined polarization state. As an explanation, in a predefined condition of the remanent-polarizable layer, the two polarization states (in some aspects, the two memory states) associated with the positive and the negative residual polarizations may both be equally stable, and there may be no polarization state favored over the other. The hysteresis curve may thus be centered in the diagram with respect to the origin of both E and P.

The behavior over time of the remanent-polarizable layer will now be described in more detail assuming, as an exemplary case, that the remanent-polarizable layer is residing, at a time t0, in the negative polarization state. It is thus assumed that the remanent-polarizable layer has negative residual polarization, $P^-$, in absence of an applied electric field, E, as illustratively represented by the black dot in FIG. 2A. The opposite scenario in which the remanent-polarizable layer is residing, at a time t0, in the positive polarization state will be described in further detail below, for example in relation to FIG. 3A to FIG. 3D.

According to various aspects, during a storage time, the polarization state the remanent-polarizable layer was initially residing in (in this exemplary case, the negative polarization state) may become favored over any other polarization state, for example it may become an imprinted polarization state. During the storage time (e.g., at a time t1 subsequent to the time t0, for example after 1 hour, after 10 hours, after 1 day, after 10 days, etc.) the polarization properties of the remanent-polarizable layer may shift. Illustratively, during such period of time, the value of the first coercive field, $E_C^+$, may shift to an imprinted value of the first (e.g., positive) coercive field, $E_{C,IMP}^+$, and the value of the second coercive field, $E_C^-$, may shift to an imprinted value of the second (e.g., negative) coercive field, $E_{C,IMP}^-$. Moreover, during such period of time, the value of the first residual polarization, $P^+$, of the remanent-polarizable layer may shift to an imprinted value of the first (e.g., positive) residual polarization, $P_{IMP}^+$, and the value of the second residual polarization, $P^-$, may shift to an imprinted value of the second (e.g., negative) residual polarization, $P_{IMP}^-$. Illustratively, an actual value of the coercive field(s) and of the residual polarization(s) may be different from the respective predefined values. This is shown, for example, in FIG. 2B.

According to various aspects, the actual coercive field associated with the non-imprinted polarization state may be higher (e.g., it may have a greater absolute value) than a predefined coercive field associated with that polarization state. In various aspects, a non-imprinted polarization state may include a polarization state of a remanent-polarizable layer in an imprinted condition other than the imprinted (e.g., favored) polarization state. In this exemplary case, the actual positive coercive field, $E_{C,IMP}^+$, may be higher than the predefined positive coercive field, $E_C^+$. Thus, a higher (e.g., more positive) electric field may be required to switch the polarization state of the remanent-polarizable layer from the negative polarization state (the imprinted polarization state) to the positive polarization state (the non-imprinted polarization state). Accordingly, an actual coercive field associated with an imprinted polarization state may be lower (e.g., it may have a smaller absolute value) than a predefined coercive field associated with that polarization state. In this exemplary case, the actual negative coercive field, $E_{C,IMP}^+$, may be lower than the predefined negative coercive field, $E_C^-$. According to various aspects, the value of the positive coercive field, $E_C^+$, and the value of the negative coercive field, $E_C^-$, may thus shift towards more positive (or less negative) values during the storage time, in the case that the imprinted polarization state is a negative polarization state. Illustratively, it may be more energetically demanding to move away from the imprinted polarization state, and it may be less energetically demanding to bring the remanent-polarizable layer into the imprinted polarization state. The shift may be represented by a coercive field shift, $\Delta E_C$, which may be or represent the difference between the actual value of the positive coercive field, $E_{C,IMP}^+$, and the predefined value of the positive coercive field, $E_C^+$, or between the actual value of the negative coercive field, $E_{C,IMP}^-$, and the predefined value of the negative coercive field, $E_C^-$. According to various aspects, the coercive field shift, $\Delta E_C$, may be substantially the same for the positive coercive field, $E_C^+$, and the negative coercive field, $E_C^-$. The sign of the coercive field shift, $\Delta E_C$, (e.g., a direction of the shift) may depend on the imprinted polarization state (e.g., it may be positive for an imprinted negative polarization state, and it may be negative for an imprinted positive polarization state).

According to various aspects, the value of the actual residual polarization associated with the imprinted polarization state may be higher (e.g., it may have a greater absolute value) than the predefined value of the residual polarization for that polarization state. In this exemplary case, the actual value of the negative residual polarization, $P_{IMP}^-$, may be higher than the predefined value of the negative residual polarization, $P^-$, since the negative polarization state may have become favored during the storage time. Accordingly, the actual value of the residual polarization associated with a non-imprinted polarization state may be lower (e.g., it may have a smaller absolute value) than the predefined value of the residual polarization associated with that polarization state. In this exemplary case, the actual value of the positive residual polarization, $P_{IMP}^+$, may be lower than the predefined value of the positive residual polarization, $P^+$. According to various aspects, the positive residual polarization, $P^+$, and the negative residual polarization, $P^-$, may thus shift towards more negative (or less positive) values during the storage time, in the case that the imprinted polarization state is a negative polarization state. In various aspects, the shift may be represented by a positive residual polarization shift, $\Delta P^+$, which may be or represent the difference between the actual value of the positive residual polarization, $P_{IMP}^+$, and the predefined value of the positive residual polarization, $P^+$. In various aspects, the shift may be represented by a negative residual polarization shift, $\Delta P^-$, which may be or represent the difference between the actual value of the negative residual polarization, $P_{IMP}^-$, and the predefined value of the negative residual polarization, $P^-$. According to various aspects, the residual polarization shift associated with the imprinted polarization state may be smaller than the residual polarization shift associated with a non-imprinted polarization state. The value and the sign of a polarization shift may depend on the polarization state associated therewith. In this exemplary case, for an imprinted negative polarization state, the negative residual polarization shift, $\Delta P^-$, may be smaller than the positive residual polarization shift, $\Delta P^+$. As an explanation, a reduction of an absolute value of the predefined residual polarization associated with a non-imprinted polarization state may be greater than an increase of an absolute value of the predefined residual polarization associated with an imprinted polarization state. In this exemplary case, for an imprinted negative polarization state, a reduction of an absolute value of the positive residual polarization, $P^+$, may be greater than an increase of an absolute value of the negative residual polarization, $P^-$.

Figure 2B:
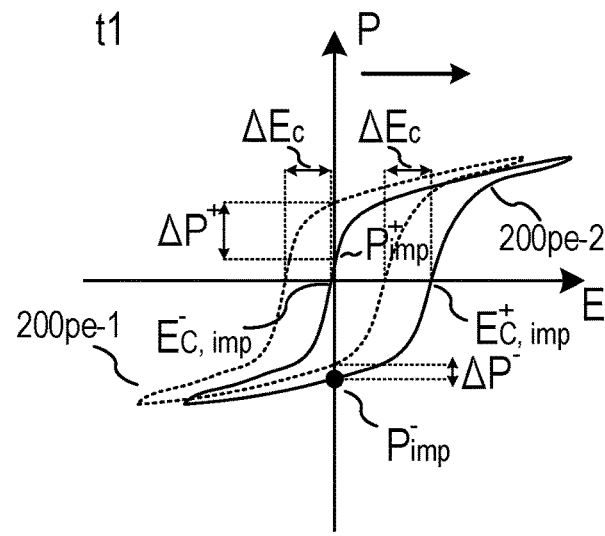
Figure 2C:
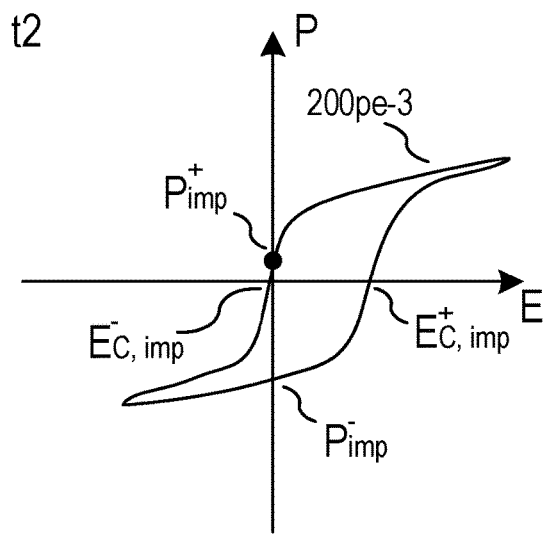
Figure 2D:
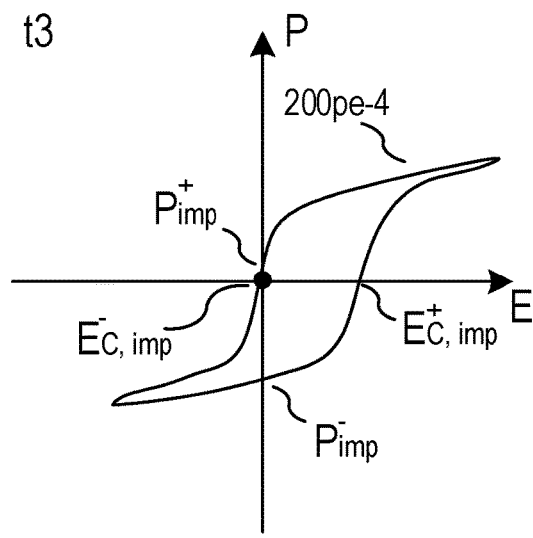

The imprinting may lead to issues in the case that the remanent-polarizable layer is brought (and stored) into the opposite polarization state with respect to the imprinted polarization state, as shown, for example, in FIG. 2C and FIG. 2D.

According to various aspects, the hysteresis loop 200*pe*-3 in FIG. 2C and the hysteresis loop 200*pe*-4 in FIG. 2D may describe that after the polarization state has been switched (e.g., in a conventional writing scheme) from the initial imprinted polarization state into the opposite non-imprinted polarization state, the polarization state of the remanent-polarizable layer may not be stable. Illustratively, the polarization properties of the remanent-polarizable layer may further shift, e.g. in the same direction as during the previous storage period. This may be due to the imprinted condition of the remanent-polarizable layer and/or to the lower actual absolute value of the residual polarization associated with the non-imprinted polarization state. Thus, the remanent-polarizable layer may not maintain such value of the residual polarization (e.g., the hysteresis curve may further shift). In this exemplary case, after the switch the remanent-polarizable layer may have the actual positive residual polarization, $P_{IMP}^+$, in absence of an applied electric field, E, as shown, for example in FIG. 2C. Due to the lower absolute value of the imprinted positive residual polarization, $P_{IMP}^+$, with respect to a predefined (e.g., stable) value of the positive residual polarization, $P^+$, the remanent-polarizable layer may not maintain such value of the residual polarization. Further storage in this polarization state may lead to even stronger degradation and to a further depolarization (e.g., to a further reduction of the residual polarization of this polarization state). The actual value of the residual polarization may further decrease substantially to zero over time (e.g., at a time t3 subsequent to time t2, for example after 10 ms, after 10 s, after 10 min, etc.), as shown, for example, in FIG. 2D (e.g., the hysteresis loop 200*pe*-4 is further shifted towards more positive electric field values). The effects of such imprinting of the polarization state of a remanent-polarizable layer on the memory properties of a memory cell including the remanent-polarizable layer will be explained in further detail below, for example in relation to FIG. 2E to FIG. 2H.

FIG. 2E, FIG. 2F, FIG. 2G, and FIG. 2H illustrate electrical characteristics of a memory cell including a remanent-polarizable layer and a field-effect transistor (e.g., a field-effect transistor structure), according to various aspects. FIG. 2E, FIG. 2F, FIG. 2G, and FIG. 2H show each a current/voltage (I-V) diagram, wherein the logarithm of a current flow from a drain node to a source node of the FET, referred to as drain current, $I_D$, is plotted versus the gate-source voltage, $V_{GS}$.

The FIG. 2E to FIG. 2H may refer, for example, to an n-type FET based memory cell. Illustratively, the diagrams in FIG. 2E to FIG. 2H may illustrate $Log(I_D)$ plotted versus $+V_{GS}$ in the case that an n-type FET based memory cell is considered, and may illustrate $Log(I_D)$ plotted versus $-V_{GS}$ in the case that a p-type FET based memory cell is considered. Illustratively, for a p-type FET based memory cell the characteristic may be mirrored with respect to the current axis (e.g., with respect to $V_{GS}=0$) as compared to an n-type FET based memory cell.

According to various aspects, the drain current, $I_D$, may vary as a function of a gate-source voltage, $V_{GS}$, provided to the memory cell and/or as a function of the memory state (e.g., LVT state or HVT state) the memory cell is residing in. A current flow through the memory cell may reflect the memory state the memory cell is residing in, in the case that a gate-source voltage, $V_{GS}$, provided to the memory cell falls between the first threshold voltage, $V_{L-th}$, and the second threshold voltage, $V_{H-th}$. According to various aspects, the threshold voltages $V_{L-th}$, $V_{H-th}$ of the memory cell may define a memory window 220 associated with the memory cell. The memory window 220 may define a range of gate-source voltages, $V_{GS}$, (e.g., a range of gate voltages, $V_G$, in the case that the source voltage, $V_S$, is 0 V), which may be provided to the memory cell to determine its memory state.

As an example, a readout voltage, $V_R$, having a value falling between the first threshold voltage, $V_{L-th}$, and the second threshold voltage, $V_{H-th}$, (e.g., falling within the memory window 220) may be applied between the gate node and the source node of the memory cell. In the case that the memory cell is residing in the first memory state, for example the LVT state, a conductive state of the memory cell may be detected (e.g., a drain current above a reference current, $I_{ref}$, for example a reference current of a sense amplifier used for detecting the drain current, $I_D$), for example associated with a logic "1". In the case that the memory cell is residing in the second memory state, for example the HVT state, a non-conductive state of the memory cell may be detected (e.g., a drain current below a reference current, $I_{ref}$), for example associated with a logic "0".

Figure 2E:
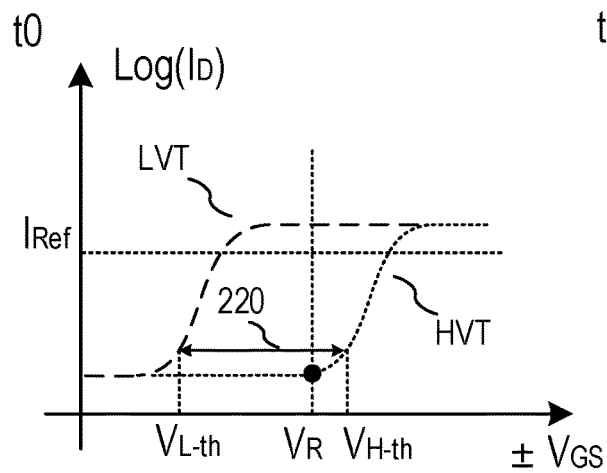
FIG. 2E, FIG. 2F, FIG. 2G, and FIG. 2H show each a current/voltage characteristic of a memory cell, according to various aspects.

FIG. 2E shows the electrical characteristic of a FET based memory cell having a remanent-polarizable layer with the polarization characteristics as shown exemplarily in FIG. 2A. The low threshold voltage, $V_{L-th}$, and the high threshold voltage, $V_{H-th}$, of the memory cell may have the respective predefined values, which may depend on the (e.g., intrinsic) properties of the memory cell. Illustratively, a first predefined threshold voltage, $V_{L-th}$, may be associated with a first memory state (e.g., LVT state) and a second predefined threshold voltage, $V_{H-th}$, may be associated with a second memory state (e.g., HVT state) of the memory cell. Accordingly, the memory window 220 of the memory cell may have its predefined width, and may be positioned at its predefined voltage range. As shown in FIG. 2E, the memory cell may be configured to prevent a substantial current flow when the readout voltage $V_R$ is applied, such that a drain current, $I_D$, below a reference current, $I_{ref}$, may be detected during a readout. Accordingly, a non-conductive state of the memory cell may be determined in this case.

During a storage time, a change of the electronic properties of the memory cell may be observed. An actual value of the low threshold voltage, $V_{L-th}$, of the memory cell may shift, for example, to a lower or higher voltage with respect to its predefined value as a function of time. An actual value of the high threshold voltage, $V_{H-th}$, may shift, for example, to a lower or higher voltage with respect to its predefined value as a function of time. Accordingly, an actual position of the memory window may shift to a higher voltage range or to a lower voltage range with respect to its predefined position as a function of time, as explained in more detail below.

Figure 2F:
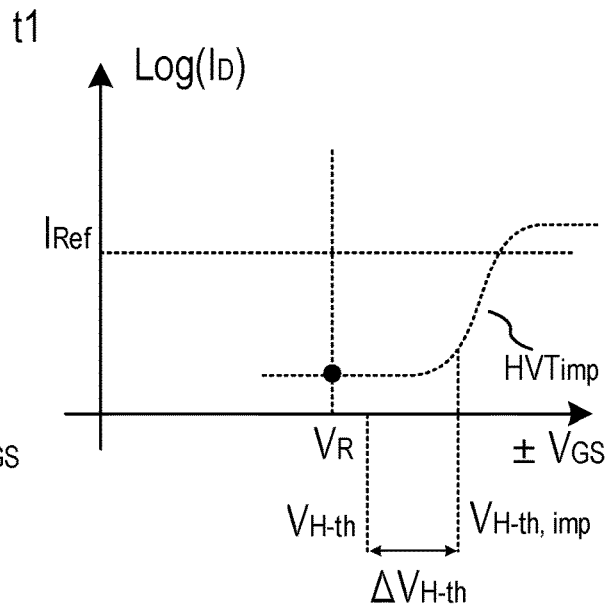

FIG. 2F shows the electrical characteristic of a FET based memory cell having a remanent-polarizable layer with the polarization characteristics as shown exemplarily in FIG. 2B, for example wherein the remanent-polarizable layer had the polarization characteristics as shown in FIG. 2A and wherein the memory cell was stored for a storage time leading to the polarization characteristics as shown exemplarily in FIG. 2B. As a result of the changed polarization characteristics, the memory cell may have an imprinted low threshold voltage, $V_{L-th,IMP}$, and an imprinted high threshold voltage, $V_{H-th,IMP}$. Accordingly, the memory cell may have an imprinted memory window. A shift in the characteristic curves representing the LVT state and the HVT state may also be observed.

In the exemplary case illustrated in FIG. 2E and FIG. 2F, starting from the initial HVT state, the actual values of the threshold voltages may be shifted to higher values (e.g., to greater values of the gate-source-voltage, $V_{GS}$). The actual high threshold voltage, $V_{H-th,IMP}$, may be higher (e.g., it may have a greater absolute value) than the predefined high threshold voltage, $V_{H-th}$. The actual low threshold voltage, $V_{L-th,IMP}$, may be higher (e.g., it may have a greater absolute value) than the predefined low threshold voltage, $V_{L-th}$. Accordingly, in this exemplary case, the memory window 220 may be shifted to higher voltage values (e.g., to more positive values of the gate-source-voltage, $V_{GS}$). The shift of the low threshold voltage may be represented by a first (e.g., low) threshold voltage shift, $\Delta V_{L-th}$, which may be or represent the difference between the actual low threshold voltage, $V_{L-th,IMP}$, and the predefined low threshold voltage, $V_{L-th}$ (see FIG. 2G). The shift of the high threshold voltage may be represented by a second (e.g., high) threshold voltage shift, $\Delta V_{H-th}$, which may be or represent the difference between the actual high threshold voltage, $V_{H-th,IMP}$, and the predefined high threshold voltage, $V_{H-th}$ (see FIG. 2F). According to various aspects, the threshold voltage associated with a non-favored memory state may shift by a greater amount than the threshold voltage associated with the favored memory state. In this case, the low threshold voltage shift, $\Delta V_{L-th}$, may thus be greater (e.g., 1 V greater, 2 V greater, etc.) than the high threshold voltage shift, $\Delta V_{H-th}$.

In the case that the memory cell is residing in the favored memory state (e.g., in the $HVT_{IMP}$ state shown in FIG. 2F), the memory cell may still prevent a substantial current flow between the source node and drain node (illustratively, after a storage time). In this case, the drain current, $I_D$, may be still below the reference current, $I_{ref}$, as shown in FIG. 2G.

In general, a change of the memory properties of a memory cell (e.g., due to imprinting) may lead to issues in the case that the memory cell is written by means of a conventional writing scheme (illustratively, a writing scheme or operation not including a precondition signal). The conventional writing scheme may lead to the result that the memory cell may reside in another memory state (e.g., in a degraded, or non-predefined memory state, for example the $LVT_d$ state shown in FIG. 2G) other than the favored memory state. It was found, that the memory state a memory cell is residing in may not be correctly read out if the memory cell has a favored memory state and is residing in a (e.g., degraded) memory state other than the favored memory state. In other words, conventional writing scheme may not assure a correct read out of a newly written memory state different from the favored memory state, thus leading to readout fails.

Figure 2G:
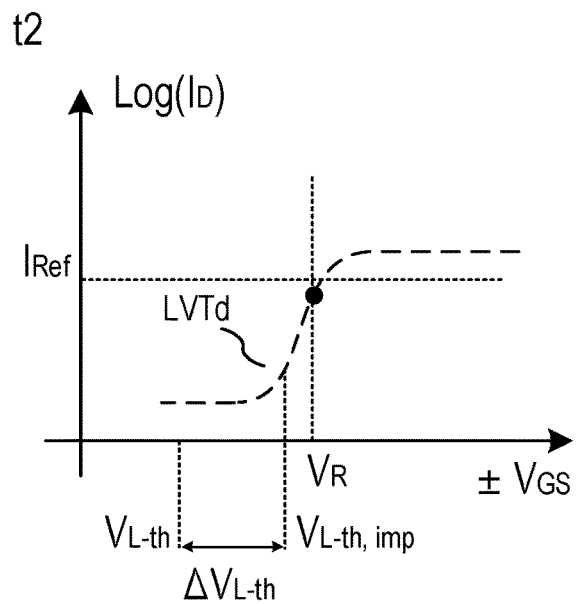

FIG. 2G shows the electrical characteristic of a FET based memory cell having a remanent-polarizable layer with the polarization characteristics as shown exemplarily in FIG. 2C, for example wherein the remanent-polarizable layer had the polarization characteristics as shown in FIG. 2B and wherein the remanent-polarizable layer was written into the other polarization state as shown exemplarily in FIG. 2C. Illustratively, the memory cell having an imprinted $HVT_{IMP}$ state may be written (e.g., at a time t2 subsequent to a time t1) by means of a conventional writing scheme not to the initial LVT state, as shown in FIG. 2A, but in contrast to a degraded $LVT_d$ state, as shown in FIG. 2G.

After such (e.g., conventional) write operation, the memory cell should allow a substantial drain current, $I_D$ (illustratively, a current greater than the reference current, $I_{ref}$) to identify the memory state. However, as shown in FIG. 2G, by applying the readout voltage, $V_R$, the drain current, $I_D$, may be below the reference current, $I_{ref}$. Illustratively, a memory cell having an imprinted $HVT_{IMP}$ state and switched into the $LVT_d$ state may prevent a substantial current flow between its source node and drain node. This may for example be due to the shift of the memory window (e.g., due to the shift in the characteristics of the LVT state and HVT state). Consequently, the memory state the memory cell is residing in may not be correctly read out (e.g., in this case it would be still read out as HVT state instead of the correct LVT state). In general, it may be possible to apply a different (e.g., in this case higher) readout voltage, $V_R$, to determine the memory state the memory cell is residing in. However, this may be energetically unfavorable, and it may also lead to readout fails since it may not be known, a priori, if and in which direction the memory window of the memory cell may have shifted (e.g., it may not be preferable to determine a suitable readout voltage to be applied each time before reading).

Figure 2H:
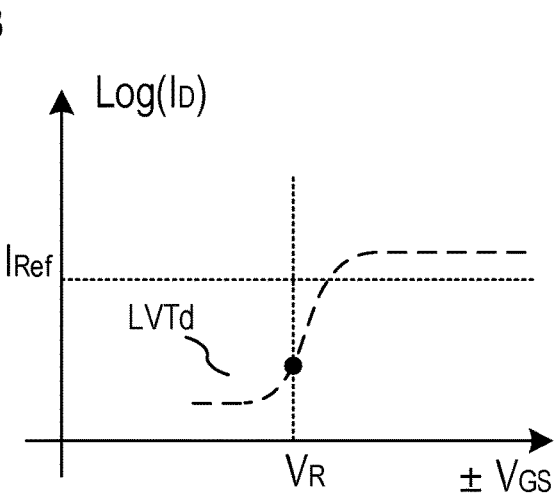

According to various aspects, the memory properties of a memory cell having a favored memory state and residing in a memory state other than the favored memory state may further change as a function of time (as shown in FIG. 2H). In other words, after a certain period of time (e.g., after 10 ms, after 10 s, after 10 min, etc.) has passed from the write operation by means of which the memory state has been switched to a non-favored memory state, the behavior of the memory cell may further depart from an expected behavior of the memory cell. As an example, a drain current, $I_D$, determined during readout of a memory cell having an imprinted $HVT_{IMP}$ state and residing for a storage time in the degraded $LVT_d$ state may be further below the reference current, $I_{ref}$ (as shown, for example, in FIG. 2H). As another example, a drain current, $I_D$ determined during readout of a memory cell having an imprinted $LVT_{IMP}$ state and residing in a degraded $HVT_d$ state may be further above the reference current, $I_{ref}$ (see FIG. 3H).

FIG. 2H shows the electrical characteristic of a FET based memory cell having a remanent-polarizable layer with the polarization characteristics as shown exemplarily in FIG. 2D, e.g. wherein the remanent-polarizable layer had the polarization characteristics as shown in FIG. 2C and was stored for a storage time (e.g., at a time t3 subsequent to time t2, for example after 10 ms, after 10 s, after 10 min, etc.). The characteristic of the $LVT_d$ state may shift further towards higher gate-source-voltage, $V_{GS}$, values. Illustratively, the further depolarization described, for example, in relation to FIG. 2D, may lead to an almost complete closure of the memory window. Consequently, by applying the readout voltage, $V_R$, the drain current, $I_D$, may be further below the reference current, $I_{ref}$. The memory state the memory cell is residing in may thus be not correctly determined, thus leading to a read fail.

FIG. 3A, FIG. 3B, FIG. 3C, and FIG. 3D respectively show a diagram illustrating polarization characteristics of a remanent-polarizable layer, similarly to FIG. 2A to FIG. 2D, e.g. a respective hysteresis loop 300pe-1, 300pe-2, 300pe-3, 300pe-4.

Figure 3A:
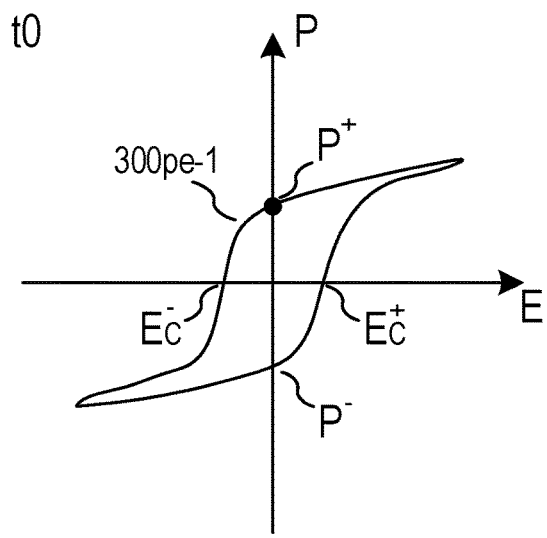
FIG. 3A, FIG. 3B, FIG. 3C, and FIG. 3D show each a polarization characteristic of a remanent-polarizable layer, according to various aspects.

According to various aspects, FIG. 3A illustrates an exemplary predefined condition of a remanent-polarizable layer (e.g., a predefined condition of a memory cell including a remanent-polarizable layer), and may be analogous to FIG. 2A. The behavior over time of the remanent-polarizable layer will now be described in more detail assuming, as an exemplary case, that the remanent-polarizable layer is residing, at a time t0, in the positive polarization state. It is thus assumed that the remanent-polarizable layer has positive residual polarization, $P^+$, in absence of an applied electric field, E, as illustratively represented by the black dot in FIG. 3A. This may represent an opposite scenario with respect to the configuration described, for example, in relation to FIG. 2A.

Figure 3B:
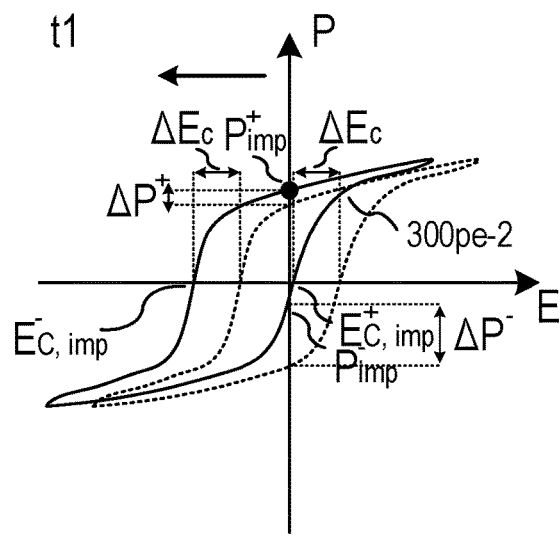

In this exemplary case, after a storage time, as shown in FIG. 3B, the actual negative coercive field, $E_{C,IMP}^-$, may be higher (e.g., it may have a greater absolute value) than the predefined negative coercive field, $E_C^-$. Thus, a higher (e.g., more negative) electric field may be required to switch the polarization state of the remanent-polarizable layer from the positive polarization state (the imprinted polarization state) to the negative polarization state (the non-imprinted polarization state). Accordingly, the actual positive coercive field, $E_{C,IMP}^+$, may be lower than the predefined positive coercive field, $E_C^+$. According to various aspects, the value of the positive coercive field, $E_C^+$, and the value of the negative coercive field, $E_C^-$, may thus shift towards more negative (or less positive) values during the storage time, in the case that the imprinted polarization state is a positive polarization state. The sign of the coercive field shift, $\Delta E_C$, may for example be opposite with respect to the coercive field shift describe above in relation to FIG. 2B.

As also shown in FIG. 3B, in this exemplary case, the actual value of the positive residual polarization, $P_{IMP}^+$, may be higher than the predefined value of the positive residual polarization, $P^+$, since the positive polarization state may have become favored during the storage time. Accordingly, the actual value of the negative residual polarization, $P_{IMP}^-$, may be lower than the predefined value of the negative residual polarization, P. According to various aspects, the positive residual polarization, $P^+$, and the negative residual polarization, $P^-$, may thus shift towards more positive (or less negative) values during the storage time, in the case that the imprinted polarization state is a positive polarization state. In this case, for an imprinted positive polarization state, the negative residual polarization shift, $\Delta P^-$, may be greater than the positive residual polarization shift, $\Delta P^+$. For an imprinted positive polarization state, a reduction of an absolute value of the negative residual polarization, $P^-$, may be greater than an increase of an absolute value of the positive residual polarization, $P^+$.

Figure 3C:
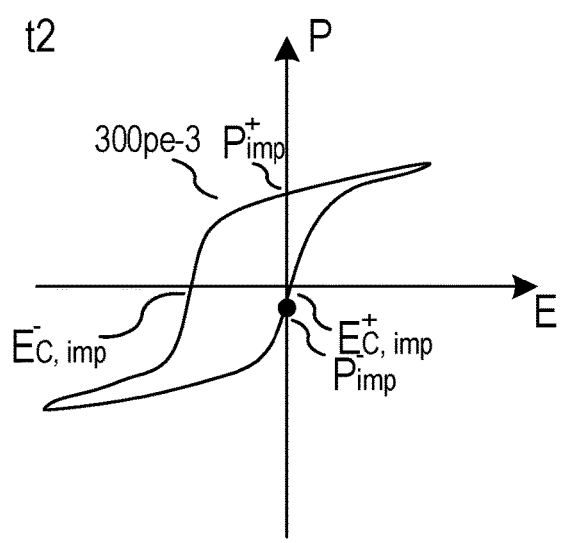
Figure 3D:
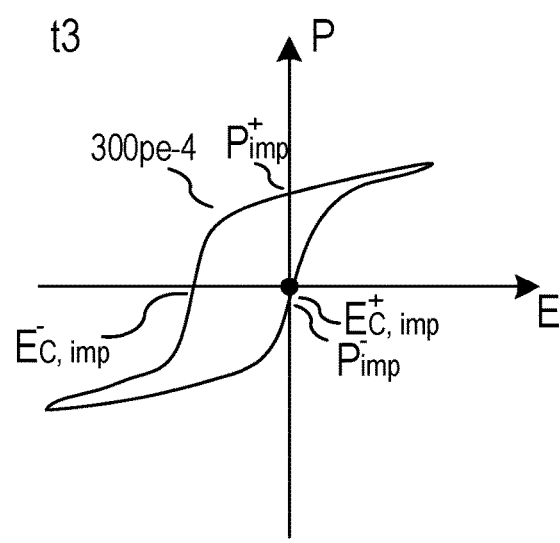

The imprinting may lead to issues in the case that the remanent-polarizable layer is brought (and stored) into the opposite polarization state with respect to the imprinted polarization state, as shown, for example, in FIG. 3C and FIG. 3D.

According to various aspects, the hysteresis loop 300pe-3 in FIG. 3C and the hysteresis loop 300pe-4 in FIG. 3D may describe that after the polarization state has been switched (e.g., in a conventional writing scheme) from the initial imprinted polarization state into the opposite non-imprinted polarization state, the polarization state of the remanent-polarizable layer may not be stable. In this exemplary case, after the switch the remanent-polarizable layer may have the actual negative residual polarization, $P_{IMP}^-$, in absence of an applied electric field, E, as shown, for example in FIG. 3C. Due to the lower absolute value of the imprinted negative residual polarization, $P_{IMP}^-$, with respect to a predefined value of the negative residual polarization, $P^-$, the remanent-polarizable layer may not maintain such value of the residual polarization. Further storage in this polarization state may lead to even stronger degradation and the actual value of the residual polarization may further decrease substantially to zero over time (e.g., at a time t3 subsequent to time t2), as shown, for example, in FIG. 3D (e.g., the hysteresis loop 300pe-4 is further shifted towards more positive electric field values). The effects of such imprinting of the polarization state of a remanent-polarizable layer on the memory properties of a memory cell including the remanent-polarizable layer will be explained in further detail below, for example in relation to FIG. 3E to FIG. 3H.

FIG. 3E, FIG. 3F, FIG. 3G, and FIG. 3H illustrate electrical characteristics of a memory cell including a remanent-polarizable layer and a field-effect transistor (e.g., a field-effect transistor structure), according to various aspects. FIG. 3E, FIG. 3F, FIG. 3G, and FIG. 3H may be analogous to FIG. 2E, FIG. 2F, FIG. 2G, and FIG. 2H.

Figure 3E:
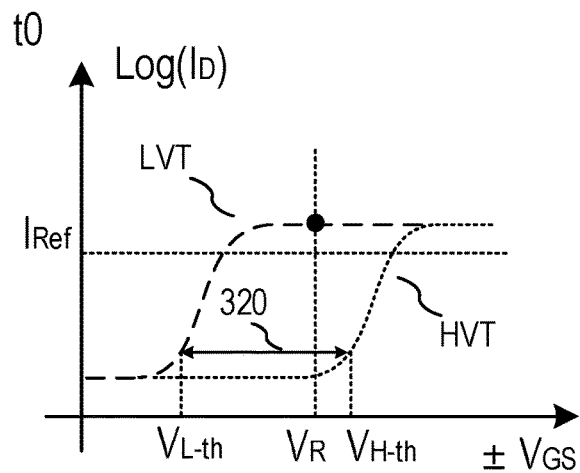
FIG. 3E, FIG. 3F, FIG. 3G, and FIG. 3H show each a current/voltage characteristic of a memory cell, according to various aspects.

FIG. 3E shows the electrical characteristic of a FET based memory cell having a remanent-polarizable layer with the polarization characteristics as shown exemplarily in FIG. 3A. The low threshold voltage, $V_{L-th}$, and the high threshold voltage, $V_{H-th}$, of the memory cell may have the respective predefined values. Accordingly, the memory window 320 of the memory cell may have its predefined width, and may be positioned at its predefined voltage range. As shown in FIG. 3E, the memory cell may be configured to allow a substantial current flow when the readout voltage $V_R$ is applied, such that a drain current, $I_D$, above a reference current, $I_{ref}$, may be detected during a readout. Accordingly, a conductive state of the memory cell may be determined in this case.

Figure 3F:
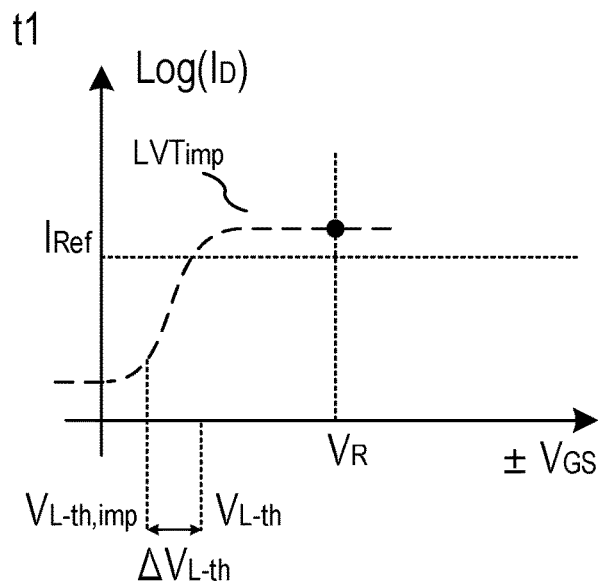

FIG. 3F shows the electrical characteristic of a FET based memory cell having a remanent-polarizable layer with the polarization characteristics as shown exemplarily in FIG. 3B, for example wherein the remanent-polarizable layer had the polarization characteristics as shown in FIG. 3A and wherein the memory cell was stored for a storage time leading to the polarization characteristics as shown exemplarily in FIG. 3B.

In the exemplary case illustrated in FIG. 3E and FIG. 3F, starting from the initial LVT state, the actual values of the threshold voltages may be shifted to lower values (e.g., to smaller values of the gate-source-voltage, $V_{GS}$). The actual high threshold voltage, $V_{H-th,IMP}$, may be lower (e.g., it may have a smaller absolute value) than the predefined high threshold voltage, $V_{H-th}$. The actual low threshold voltage, $V_{L-th,IMP}$, may be smaller than the predefined low threshold voltage, $V_{L-th}$. Accordingly, in this exemplary case, the memory window 320 may be shifted to lower voltage values (e.g., to less positive values of the gate-source-voltage, $V_{GS}$). In this case, the high threshold voltage shift, $\Delta V_{H-th}$, may be greater (e.g., 1 V greater, 2 V greater, etc.) than the low threshold voltage shift, $\Delta V_{L-th}$.

In the case that the memory cell is residing in the favored memory state (e.g., in the $LVT_{IMP}$ state shown in FIG. 3F), the memory cell may still allow a substantial current flow between the source node and drain node (illustratively, after a storage time). In this case, the drain current, $I_D$, may be still above the reference current, $I_{ref}$, as shown in FIG. 3F.

Figure 3G:
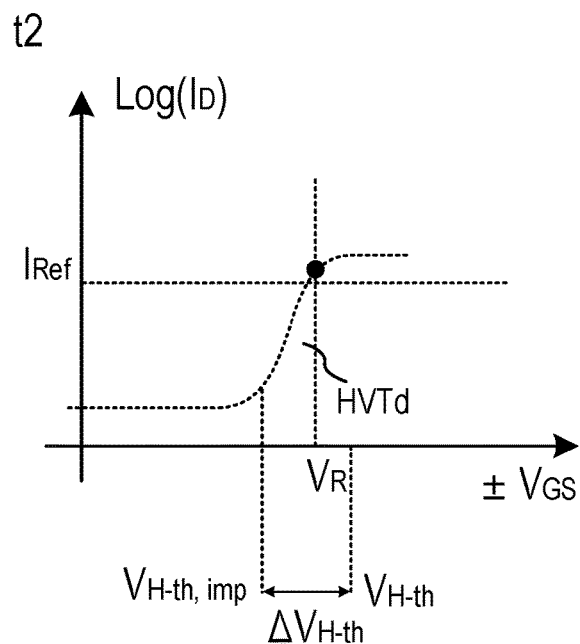

A conventional writing scheme may lead to the result that the memory cell may reside in another memory state (e.g., in a degraded, or non-predefined memory state, for example the $HVT_d$ state shown in FIG. 3G) other than the favored memory state. FIG. 3G shows the electrical characteristic of a FET based memory cell having a remanent-polarizable layer with the polarization characteristics as shown exemplarily in FIG. 3C, for example wherein the remanent-polarizable layer had the polarization characteristics as shown in FIG. 3B and wherein the remanent-polarizable layer was written into the other polarization state as shown exemplarily in FIG. 3C. Illustratively, the memory cell having an imprinted $LVT_{IMP}$ state may be written (e.g., at a time t2 subsequent to a time t1) by means of a conventional writing scheme not to the initial HVT state, as shown in FIG. 2A, but in contrast to a degraded $HVT_d$ state, as shown in FIG. 2G.

After such (e.g., conventional) write operation, the memory cell should prevent a substantial drain current, $I_D$ (illustratively, it should allow a current smaller than the reference current, $I_{ref}$) to identify the memory state. However, as shown in FIG. 3G, by applying the readout voltage, $V_R$, the drain current, $I_D$, may be above the reference current, $I_{ref}$. Illustratively, a memory cell having an imprinted $LVT_{IMP}$ state and switched into the $HVT_d$ state may allow a substantial current flow between its source node and drain node. Consequently, the memory state the memory cell is residing in may not be correctly read out (e.g., in this case it would be still read out as LVT state instead of the correct HVT state).

Figure 3H:
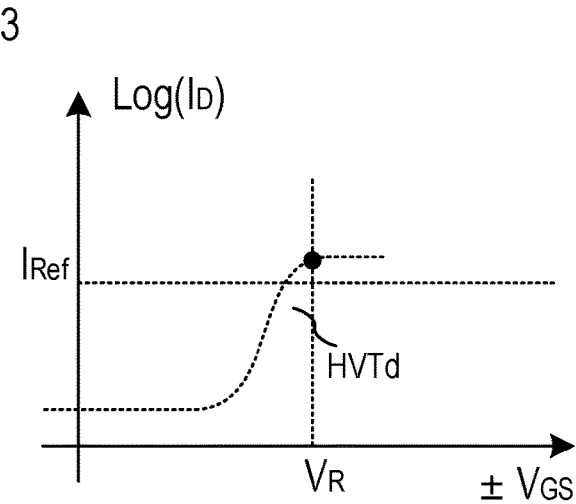

FIG. 3H shows the electrical characteristic of a FET based memory cell having a remanent-polarizable layer with the polarization characteristics as shown exemplarily in FIG. 3D, e.g. wherein the remanent-polarizable layer had the polarization characteristics as shown in FIG. 3C and was stored for a storage time (e.g., at a time t3 subsequent to time t2, for example after 10 ms, after 10 s, after 10 min, etc.). The characteristic of the $HVT_d$ state may shift further towards smaller gate-source-voltage, $V_{GS}$, values. Consequently, by applying the readout voltage, $V_R$, the drain current, $I_D$, may be above the reference current, $I_{ref}$.

According to various aspects, the conditioned write scheme described herein may reduce or substantially eliminate the occurrences of read fails by preconditioning the memory cells to be written (e.g., before writing a new memory state). Illustratively, the conditioned write scheme described herein may be configured to substantially eliminate imprint related effects or other effects occurring during a storage period, as will be discussed in further details below in relation, for example, to FIG. 4A to FIG. 4H.

FIG. 4A, FIG. 4B, FIG. 4C, and FIG. 4D respectively show a diagram illustrating polarization characteristics of a remanent-polarizable layer, e.g. a respective hysteresis loop 400pe-1, 400pe-2, 400pe-3, 400pe-4. In contrast to FIG. 2A to FIG. 2D and FIG. 3A to FIG. 3D, a conditioned write scheme is applied to avoid read failures due to imprint effects or other effects influencing the memory cell.

Figure 4A:
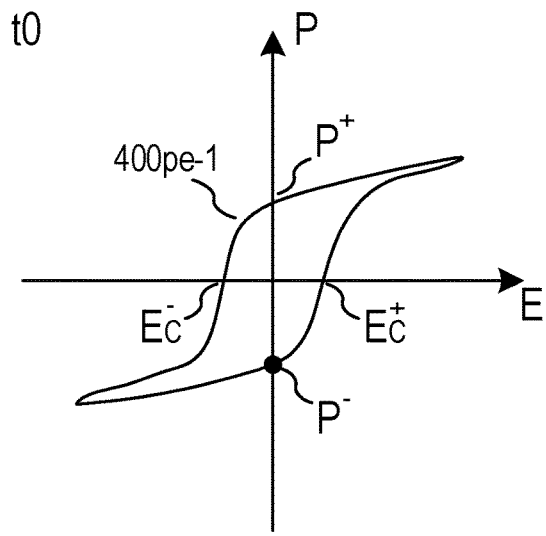
FIG. 4A, FIG. 4B, FIG. 4C, and FIG. 4D show each a polarization characteristic of a remanent-polarizable layer, according to various aspects.

According to various aspects, FIG. 4A illustrates an exemplary predefined condition of a remanent-polarizable layer (e.g., a predefined condition of a memory cell including a remanent-polarizable layer), and may be analogous to FIG. 2A and FIG. 3A. The behavior over time of the remanent-polarizable layer will now be described in more detail assuming, as an exemplary case, that the remanent-polarizable layer is residing, at a time t0, in the negative polarization state. This may represent a similar scenario as described, for example, in relation to FIG. 2A.

Figure 4B:
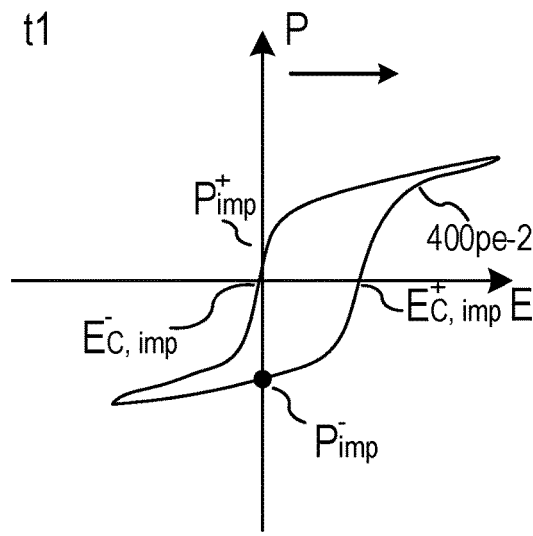

As shown in FIG. 4B, after a storage time, the negative polarization state may become favored (similar to the description above in relation to FIG. 2B). In this case, the actual value of the negative coercive field, $E_{C,IMP}^{-}$, may be smaller than the predefined value of the negative coercive field, $E_C^{-}$. Accordingly, the actual value of the positive coercive field, $E_{C,IMP}^{+}$, may be greater than the predefined value of the positive coercive field, $E_C^{+}$. As also shown in FIG. 4B, in this exemplary case, the actual value of the positive residual polarization, $P_{IMP}^{+}$, may be lower than the predefined value of the positive residual polarization, $P^{+}$. Accordingly, the actual value of the negative residual polarization, $P_{IMP}^{-}$, may be higher (e.g., greater) than the predefined value of the negative residual polarization, $P^{-}$.

According to various aspects, during or after a storage time, an actual value of the (e.g., positive and/or negative) coercive field, $E_C$, may shift to more than 150% of its predefined (e.g., initial) value, for example to more than 200% or to more than 250%. As an example, the predefined value of the positive coercive field, $E_C^+$, may be 1 MV/cm, and the actual value of the positive coercive field, $E_C^+$, may be higher than 1.5 MV/cm, for example higher than 2 MV/cm or higher than 2.5 MV/cm. During or after a storage time, also an actual value of the (e.g., positive or negative) residual polarization may shift to more than 110% of its predefined value, for example to more than 150% or to more than 200%.

According to various aspects, the conditioned write scheme described herein may be configured to reduce or substantially eliminate a change of the polarization properties of a remanent-polarizable layer before (or while) a polarization state of the remanent-polarizable layer is switched. According to various aspects, the precondition signal 110p may be configured to bring the actual polarization properties of the remanent-polarizable layer back to the respective predefined values (or at least to shift the polarization properties towards the respective predefined values). According to various aspects, the precondition signal 110p may include one or more precondition voltage pulses supplied to a remanent-polarizable layer, to modify the remanent-polarizable layer. In various aspects, the precondition signal 110p may be configured to modify the remanent-polarizable layer such that an actual value of the first coercive field, $E_C^+$, and/or of the second coercive field, $E_C^-$, of the remanent-polarizable layer is shifted to a predefined value associated with the respective coercive field. In various aspects, the precondition signal 110p may be configured to modify the remanent-polarizable layer such that an actual value of the first residual polarization, $P^+$, and/or of the second residual polarization, $P_-$, of the remanent-polarizable layer is shifted to a predefined value associated with the respective residual polarization. Illustratively, the precondition signal 110p may be configured to center (e.g., around an origin) a hysteretic P-E curve of a remanent-polarizable layer (e.g., of a memory cell). A de-centered hysteresis curve of a remanent-polarizable layer (for example the diagram 400pe-2 shown in FIG. 4B) may be centered (for example the diagram 400pe-3 shown in FIG. 4C) after the precondition signal has been supplied to the remanent-polarizable layer.

Illustratively, before the precondition signal 110p is applied to a (e.g., imprinted) remanent-polarizable layer an actual first absolute value of a first (e.g., in this case positive) coercive field may be greater than an actual second absolute value of a second (e.g., in this case negative) coercive field. The precondition signal 110p may be configured such that after the precondition signal has been applied, the actual first absolute value of the first coercive field may be substantially equal to the actual second absolute value of the second coercive field (e.g., the first absolute value and the second absolute value may be substantially equal to the respective predefined values). Illustratively, the precondition signal 110p may be configured to reduce substantially to zero a coercive field shift, $\Delta E_C$, of the remanent-polarizable layer.

According to various aspects, the precondition signal 110p may be configured such that the actual first absolute value of the first coercive field and/or the actual second absolute value of the second coercive field may be shifted by more than 25% of the respective actual value, for example more than 50%, for example more than 100%, towards the respective predefined value. According to various aspects, the precondition signal 110p may be configured such that after the precondition signal 110p has been applied a difference between the actual absolute value of the (e.g., first and/or second) coercive field and the respective predefined absolute value may be less than 100% of the predefined absolute value, for example less than 50%, for example less than 25%. As an example, in the case that the predefined absolute value of the (e.g., first and/or second) coercive field is 1 MV/cm and during a storage time shifts to an imprinted coercive field of 2.5 MV/cm, the precondition signal 110p may be configured such that after the precondition signal 110p has been applied the actual absolute value may be in the range between 1 MV/cm and 2 MV/cm, e.g., in the range between 1 MV/cm and 1.5 MV/cm.

According to various aspects, the precondition signal 110p may be configured to reduce the actual absolute value of the residual polarization associated with the imprinted polarization state (in the exemplary case shown in FIG. 4B, this may be a reduction of the absolute value of the actual negative residual polarization, $P_{IMP}^-$). Accordingly, the precondition signal 110p may be configured to increase the actual absolute value of the residual polarization associated with a polarization state other than the imprinted polarization state (e.g., opposite to the imprinted polarization state, in the exemplary case shown in FIG. 4B this may be an increase of the absolute value of the actual positive residual polarization, $P_{IMP}^+$). Illustratively, before the precondition signal 110p is applied to a (e.g., imprinted) remanent-polarizable layer an actual first absolute value of a first (e.g., in this case negative) residual polarization may be greater than an actual second absolute value of a second (e.g., in this case positive) residual polarization. The precondition signal 110p may be configured such that after the precondition signal 110p has been applied, the actual first absolute value of the first residual polarization may be substantially equal to the actual second absolute value of the second residual polarization (e.g., the first absolute value and the second absolute value may be substantially equal to the respective predefined values). Illustratively, the precondition signal 110p may be configured to reduce a first (e.g., positive) residual polarization shift, $\Delta P^+$, and a second (e.g., negative) residual polarization shift, $\Delta P^-$, substantially to zero.

According to various aspects, the precondition signal 110p may be configured such that the actual first absolute value of the first residual polarization and/or the actual second absolute value of the second residual polarization may be shifted by more than 25% of the respective actual value, for example more than 50%, for example more than 100%, towards the respective predefined value. According to various aspects, the precondition signal 110p may be configured such that after the precondition signal 110p has been applied a difference between the actual absolute value of the (e.g. first and/or second) residual polarization and the respective predefined absolute value may be less than 100% of the predefined absolute value, for example less than 50%, for example less than 25%.

According to various aspects, during a storage time, the actual value of the first coercive field and the actual value of the second coercive field may be not shifted by the same amount but in the same direction away from the respective predefined value. Therefore, in some aspects, the precondition signal 110p may be applied and during the application of the precondition signal 110p the actual value of the first coercive field and the actual value of the second coercive field are not shifted back by the same amount but at least in the same direction. As an example, the actual value of the first coercive field may be shifted more (or less) than the actual value of the second coercive field towards the respective predefined value during the application of the precondition signal 110p. The same may apply for the residual polarization instead of the coercive field.

Figure 4C:
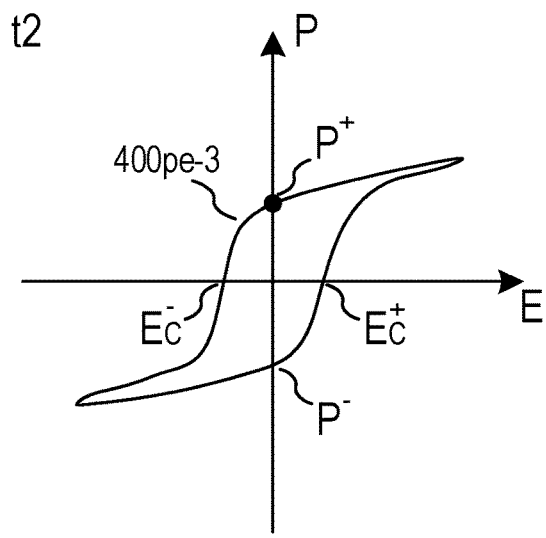
Figure 4D:
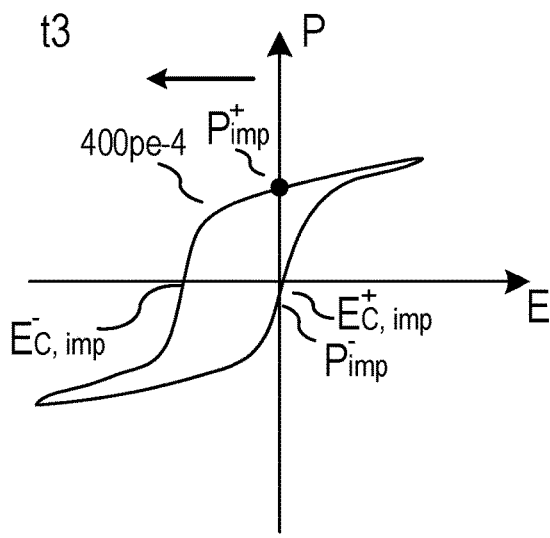

According to various aspects, the hysteresis loop 400pe-3 in FIG. 4C may illustrate an exemplary condition of the remanent-polarizable layer after (or while) a precondition signal (e.g., one or more precondition voltage pulses) have been applied to the remanent-polarizable layer. Illustratively, FIG. 4C may illustrate a condition of the remanent-polarizable layer at a time t2 subsequent to the time t1, wherein after the time t1 (or before or at the time t2) a precondition signal 110p is (or has been) applied to the remanent-polarizable layer. In this exemplary case, with respect to the (shifted) hysteresis loop 400pe-2 shown in FIG. 4B, the polarization properties of the remanent-polarizable layer have been restored to the respective predefined values. Imprint related effects or other effects affecting the remanent-polarizable layer may have thus been substantially removed (e.g., there may be no imprinted polarization state). As shown in FIG. 4C, an actual absolute value of the positive coercive field, $E_C^+$, may be substantially equal to an actual absolute value of the negative coercive field, $E_C^-$, and an actual absolute value of the positive residual polarization, $P^+$, may be substantially equal to an actual absolute value of the negative residual polarization, $P^-$.

According to various aspects, the conditioned write scheme may ensure that switching a polarization state of a previously imprinted remanent-polarizable layer leads to a stable polarization state. As an example, the precondition signal 110p may be configured such that after the precondition signal has been supplied to a remanent-polarizable layer, a polarization state of the remanent-polarizable layer may be switched and the new polarization state may be stable (e.g., the new residual polarization does not decrease over time, contrary to the description above in relation, for example, to FIG. 2D and FIG. 3D).

As an example, as shown in FIG. 4C it is assumed, after the preconditioning of the remanent-polarizable layer, that the polarization state of the remanent-polarizable layer may be switched (e.g., from the negative polarization state to the positive polarization state). The conditioned write scheme may ensure that such new polarization state may be stable. Illustratively, after the switch the remanent-polarizable layer may have an actual positive residual polarization, $P^+$, in absence of an applied electric field, E. The conditioned write scheme may ensure that such newly written (e.g., positive) residual polarization does not decrease substantially to zero as a function of time.

According to various aspects, the new polarization state may become a (new) imprinted polarization state (e.g., during a new storage time). According to various aspects, the hysteresis loop 400pe-4 in FIG. 4D may illustrate a condition of the remanent-polarizable layer at a time t3 subsequent to time t2, e.g. after a period of time (e.g., after a storage time) has passed from the switch of the polarization shown in FIG. 4C. In this exemplary case, the positive polarization state may become favored over any other polarization state, e.g. it may become an imprinted polarization state. Thus, the hysteresis loop may shift in the opposite direction with respect to the curve shown, for example, in FIG. 4B.

According to various aspects, the conditioned write scheme may ensure that this new imprinting of the preconditioned remanent-polarizable layer does not negatively affect the remanent-polarizable layer. Illustratively, the conditioned write scheme may ensure that this new imprinting does not negatively affect the memory properties of a (e.g., preconditioned) memory cell including the preconditioned remanent-polarizable layer, as will be explained in further detail below, in relation to FIG. 4E to FIG. 4H.

FIG. 4E, FIG. 4F, FIG. 4G, and FIG. 4H illustrate electrical characteristics of a memory cell including a remanent-polarizable layer and a field-effect transistor (e.g., a field-effect transistor structure), according to various aspects. FIG. 4E, FIG. 4F, FIG. 4G, and FIG. 4H may be analogous to FIG. 2E, FIG. 2F, FIG. 2G, and FIG. 2H and to FIG. 3E, FIG. 3F, FIG. 3G, and FIG. 3H; however, a conditioned write scheme is applied to avoid read failures due to imprint effects or other effects influencing the memory cell.

Figure 4E:
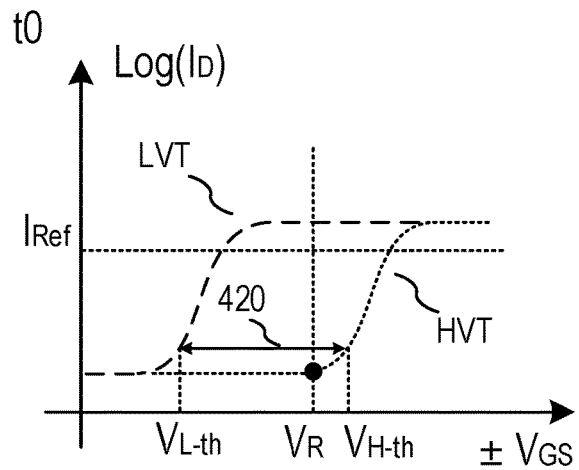
FIG. 4E, FIG. 4F, FIG. 4G, and FIG. 4H show each a current/voltage characteristic of a memory cell, according to various aspects.

FIG. 4E shows the electrical characteristic of a FET based memory cell having a remanent-polarizable layer with the polarization characteristics as shown exemplarily in FIG. 4A (and analogous to FIG. 2E). The low threshold voltage, $V_{L-th}$, and the high threshold voltage, $V_{H-th}$, of the memory cell may have the respective predefined values. Accordingly, the memory window 420 of the memory cell may have its predefined width, and may be positioned at its predefined voltage range. As shown in FIG. 4E, the memory cell may be configured to prevent a substantial current flow when the readout voltage $V_R$ is applied, such that a drain current, $I_D$, below a reference current, $I_{ref}$, may be detected during a readout. Accordingly, a non-conductive state of the memory cell may be determined in this case.

Figure 4F:
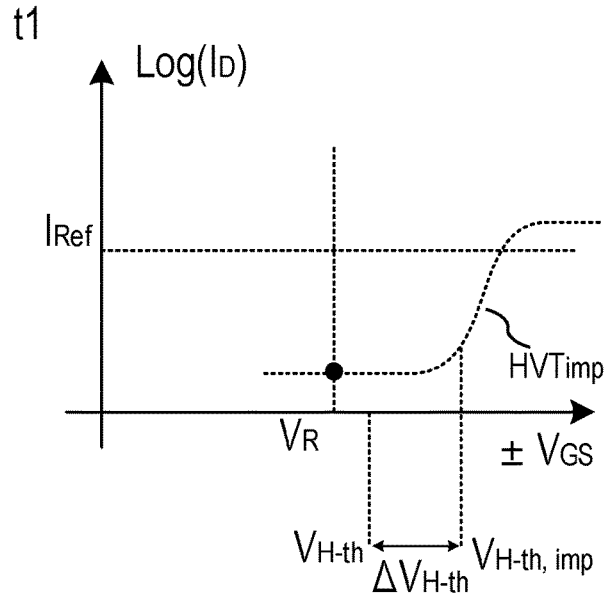

FIG. 4F illustrates the electrical characteristic of a FET based memory cell having a remanent-polarizable layer with the polarization characteristics as shown exemplarily in FIG. 4B, for example wherein the remanent-polarizable layer had the polarization characteristics as shown in FIG. 4A and wherein the memory cell was stored for a storage time leading to the polarization characteristics as shown exemplarily in FIG. 4B.

In the exemplary case illustrated in FIG. 4E and FIG. 4F, starting from the initial HVT state, the actual values of the threshold voltages may be shifted to higher values (e.g., to greater values of the gate-source-voltage, $V_{GS}$), similar to the description above in relation to FIG. 2E and FIG. 2F. Accordingly, in this exemplary case, the memory window 420 may be shifted to higher voltage values. According to various aspects, the conditioned write scheme described herein may be configured to restore the threshold voltages and/or the memory window 420 of the memory cell to the respective predefined values.

According to various aspects, the precondition signal 110p may be configured to shift a first (e.g., low) threshold voltage, $V_{L-th}$, and a second (e.g., high) threshold voltage, $V_{H-th}$, associated with the memory cell (e.g., associated with a transistor structure of the memory cell). As an example, the precondition signal 110p may include supplying one or more precondition voltage pulses to a memory cell to shift a first threshold voltage, $V_{L-th}$, and a second threshold voltage, $V_{H-th}$, associated with the memory cell. In various aspects, the precondition signal 110p may be configured to modify the field effect transistor structure such that an actual value of the first and/or second threshold voltage of the field effect transistor structure of the memory cell 102 is shifted to a predefined value associated with the respective threshold voltage. As an explanation, the precondition signal 110p may be configured such that, after the precondition signal has been applied, an actual value of the first threshold voltage, $V_{L-th}$, is substantially equal to the predefined value of the first threshold voltage, $V_{L-th}$. The precondition signal 110p may also be configured such that, after the precondition signal has been applied, an actual value of the second threshold voltage, $V_{H-th}$, is substantially equal to a predefined value of the second threshold voltage, $V_{H-th}$. Illustratively, the precondition signal 110p may be configured to shift an actual voltage position of a memory window 420 associated with a memory cell to a predefined position.

According to various aspects, during or after a storage time, the first (e.g., low) threshold voltage, $V_{L-th}$, and the second (e.g., high) threshold voltage, $V_{H-th}$, may shift to more than 150% of the respective predefined value, for example to more than 200% or more than 250%. However, the relative shift may be a function of the actual values of the respective threshold voltage. During or after a storage time, the threshold voltages may shift more than 500 mV away from the respective predefined value, for example more than 1 V, for example more than 2 V.

According to various aspects, the precondition signal 110p may be configured such that the actual value of the first threshold voltage, $V_{L-th}$, and the actual value of the second threshold voltage, $V_{H-th}$, may be shifted by more than 25% of the respective actual value, for example more than 50%, for example more than 100%, towards the respective predefined value by the precondition signal 110p. For example, the precondition signal 110p may be configured such that the actual value of the first threshold voltage, $V_{L-th}$, and the actual value of the second threshold voltage, $V_{H-th}$, may be shifted by more than 250 mV, for example more than 500 mV, for example more than 750 mV towards the respective predefined value by the precondition signal 110p.

According to various aspects, the precondition signal 110p may be configured such that after the precondition signal 110p has been applied a difference between the actual value of the (e.g., first and/or second) threshold voltage and the respective predefined absolute value may be less than 100% of the predefined value, for example less than 50%, for example less than 25%. For example, the precondition signal 110p may be configured such that after the precondition signal 110p has been applied a difference between the actual value of the (e.g., first and/or second) threshold voltage and the respective predefined absolute value may be less than 500 mV, for example less than 250 mV.

Figure 4G:
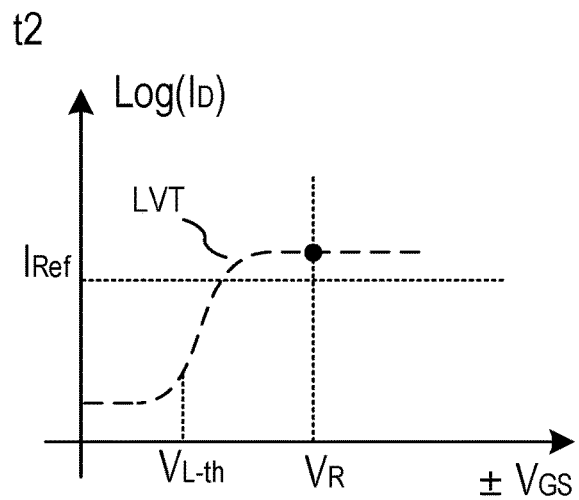

According to various aspects, FIG. 4G may illustrate an exemplary condition of the memory cell after (or while) a precondition signal (e.g., one or more precondition voltage pulses) have been applied to the memory cell. Illustratively, FIG. 4G shows the electrical characteristic of a FET based memory cell having a remanent-polarizable layer with the polarization characteristics as shown exemplarily in FIG. 4C, for example wherein the remanent-polarizable layer had the polarization characteristics as shown in FIG. 4B and wherein the remanent-polarizable layer was written into the other polarization state as shown exemplarily in FIG. 4C after being preconditioned. In this case, with respect to the (shifted) characteristic shown in FIG. 4F, the properties of the memory cell (e.g., the threshold voltages, the memory window, the LVT state characteristic, the HVT state characteristic) may be shifted to the respective predefined values. The imprint related effects or other effects affecting the memory cell may have thus been substantially removed (e.g., there may not be favored memory state). Illustratively, the LVT state (and the HVT state) characteristics may be the same or similar as the predefined condition of the memory cell shown for example in FIG. 4E.

According to various aspects, the conditioned write scheme may ensure that switching a memory state of a (previously) imprinted memory cell leads to a stable memory state (e.g., that read fails may be reduced or substantially eliminated). According to various aspects, in FIG. 4G it is assumed, as an example, that after the preconditioning of the memory, the memory state of the memory cell is switched (e.g., from the HVT state to the LVT state). For example, a write signal configured to switch the memory state of the memory cell may be applied to the memory cell. The conditioned write scheme may ensure that such new memory state may be stable.

As shown in FIG. 4G, by applying the readout voltage, $V_R$, to the preconditioned memory cell, a drain current, $I_D$, in the memory cell may be above the reference current, $I_{ref}$, such that the memory state the memory cell is residing in may be correctly determined (e.g., leading to a read success). The preconditioned memory cell that had an imprinted $HVT_{IMP}$ state and now residing in the (e.g., predefined) LVT state may allow a substantial current flow between its source node and drain node.

Figure 4H:
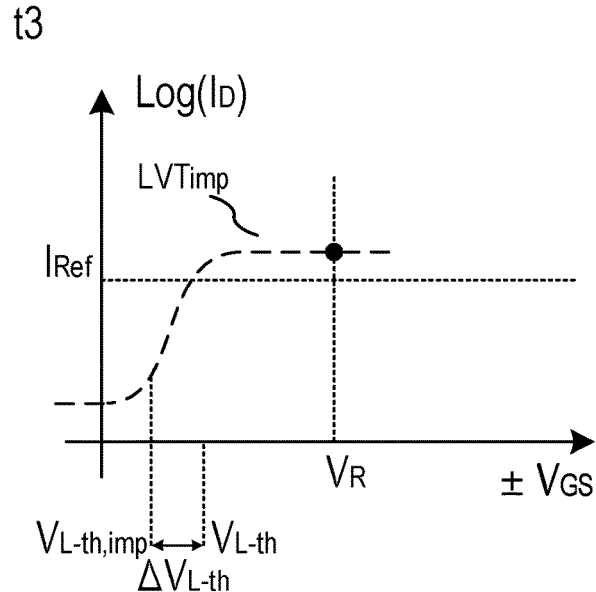

According to various aspects, the new polarization state may become a (new) imprinted polarization state (e.g., during a new storage time). According to various aspects, FIG. 4H may illustrate a characteristic of the memory cell at a time t3 subsequent to time t2, e.g. after a period of time (e.g., after a storage time) has passed from the switch of the memory state shown in FIG. 4G. Illustratively, FIG. 4H shows the electrical characteristic of a FET based memory cell having a remanent-polarizable layer with the polarization characteristics as shown exemplarily in FIG. 4D, e.g. wherein the remanent-polarizable layer had the polarization characteristics as shown in FIG. 4C and was stored for a storage time As shown in FIG. 4H the LVT state may become favored over any other memory state (it may become an imprinted $LVT_{IMP}$ state). Thus, the threshold voltages, the memory window, and the characteristics of the memory cell may shift in an opposite direction with respect to the behavior of the memory cell shown, for example, in FIG. 4F.

According to various aspects, the conditioned write scheme may ensure that this new imprinting of the preconditioned memory cell does not affect the readout of the memory state the memory cell is residing in. As shown in FIG. 4H, the characteristic of the $LVT_{IMP}$ state may shift further towards lower gate-source-voltage, $V_{GS}$, values (e.g., the actual memory window and the actual threshold voltages may shift further towards lower gate-source-voltage, $V_{GS}$, values). Thus, by applying the readout voltage, $V_R$, a drain current, $I_D$, may still be above the reference current, $I_{ref}$. The memory state the memory cell is residing may thus be correctly determined (e.g., as conductive).

FIG. 5A, FIG. 5B, FIG. 5C, FIG. 5D, and FIG. 5E show possible examples for the precondition signal to be supplied to a memory cell, according to various aspects. Illustratively, the precondition signal 110p may include any precondition voltage pulse capable of restoring a predefined condition of a memory cell (e.g., capable of substantially removing an imprint of a memory cell).

According to various aspects, a precondition voltage pulse 510 may have an amplitude, $A_p$, (also referred to as pulse height for a pulsed voltage). The amplitude, $A_p$, may be or may represent a maximum voltage value (or voltage level) associated with the precondition voltage pulse 510. In other words, the amplitude, $A_p$, may be or may represent the magnitude of a voltage level (e.g., a precondition voltage, $V_p$) associated with the precondition voltage pulse 510. Illustratively, the amplitude, $A_p$, may be or may represent a voltage level associated with the precondition voltage pulse 510 evaluated with respect to a reference voltage, $V_{ref}$ (e.g., a base voltage, $V_B$, of a memory cell arrangement). The amplitude, $A_p$, may also be referred to as peak amplitude. As a numerical example, a precondition voltage pulse 510 may have an amplitude, $A_p$, having an absolute value in a range from about 1 V to about 20 V, for example from about 2 V to about 10 V, for example from about 3 V to about 5 V.

According to various aspects, a precondition voltage pulse 510 may have a rise time, $R_p$. The rise time, $R_p$, may be or may represent the amount of time the precondition voltage pulse 510 takes to go from the reference voltage, $V_{ref}$, to the precondition voltage, $V_p$. In various aspects, the rise time, $R_p$, may be or may represent the amount of time the precondition voltage pulse 510 takes to go from a voltage level equal to about 10% of the precondition voltage, $V_p$, to a voltage level equal to about 90% of the precondition voltage, $V_p$. As a numerical example, the rise time, $R_p$, may be in the range from about 1 ns to about 100 ns, for example from about 5 ns to about 50 ns.

According to various aspects, a precondition voltage pulse 510 may have a fall time, $F_p$. The fall time, $F_p$, may be or may represent the amount of time the precondition voltage pulse 510 takes to go from precondition voltage, $V_p$, to the reference voltage, $V_{ref}$. In various aspects, the fall time, $F_p$, may be or may represent the amount of time the precondition voltage pulse 510 takes to go from a voltage level equal to about 90% of the precondition voltage, $V_p$, to a voltage level equal to about 10% of the precondition voltage, $V_p$. As a numerical example, the fall time, $F_p$, may be in the range from about 1 ns to about 100 ns, for example from about 5 ns to about 50 ns.

According to various aspects, a precondition voltage pulse 510 may have a pulse width, $PW_p$, (also referred to as pulse length or duration). The pulse width, $PW_p$, may be or may represent the amount of time during which the amplitude, $A_p$, of the precondition voltage pulse 510 is at its maximum value (e.g., the amount of time the peak amplitude of the precondition voltage pulse 510 is at the precondition voltage level). As a numerical example, the precondition voltage pulse may have a pulse width, $PW_p$, in the range from about 10 ns to about 2 ms, for example from about 100 ns to about 1500 ms, for example from about 500 ns to about 1 ms. According to various aspects, a total duration of a precondition voltage pulse 510 may be determined by the pulse width, $PW_p$, the rise time, $R_p$, and the fall time, $F_p$, of the precondition voltage pulse 510.

Figure 5A:
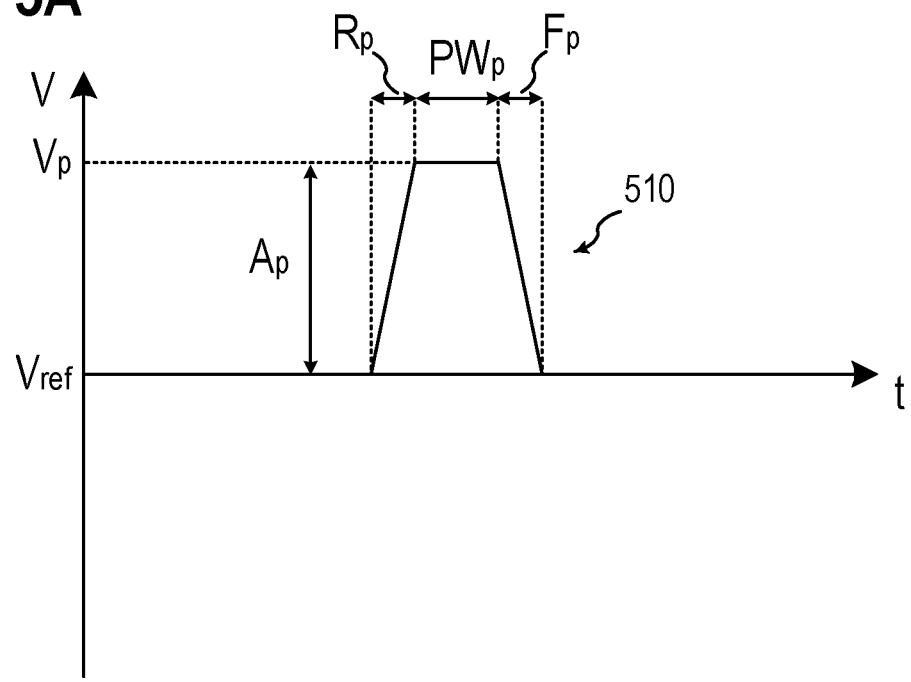
FIG. 5A, FIG. 5B, FIG. 5C, FIG. 5D, FIG. 5E, and FIG. 5F show each a precondition signal and/or a write signal, according to various aspects.
Figure 5B:
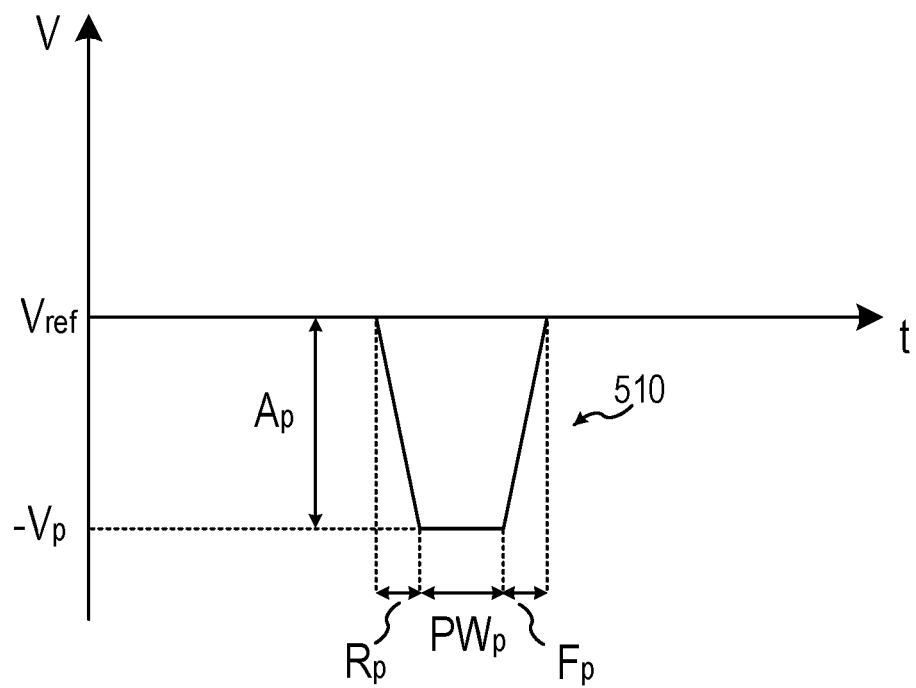

According to various aspects, the precondition signal 110p may include a single precondition voltage pulse 510 (as shown for example in FIG. 5A and FIG. 5B). According to various aspects, the precondition voltage pulse 510 may have a positive amplitude, $A_p$, (as shown for example in FIG. 5A) or a negative amplitude, $A_p$, (as shown for example in FIG. 5B). According to various aspects, the rise time, $R_p$, and the fall time, $F_p$, of the precondition voltage pulse 510 may have substantially the same value. The rise time, $R_p$, and the fall time, $F_p$, may also have different values. For example, it may take longer for the precondition voltage pulse 510 to go from the reference voltage, $V_{ref}$, to the precondition voltage, $V_p$, than for the precondition voltage pulse 510 to go from the precondition voltage, $V_p$, to the reference voltage, $V_{ref}$, or vice versa.

Figure 5C:
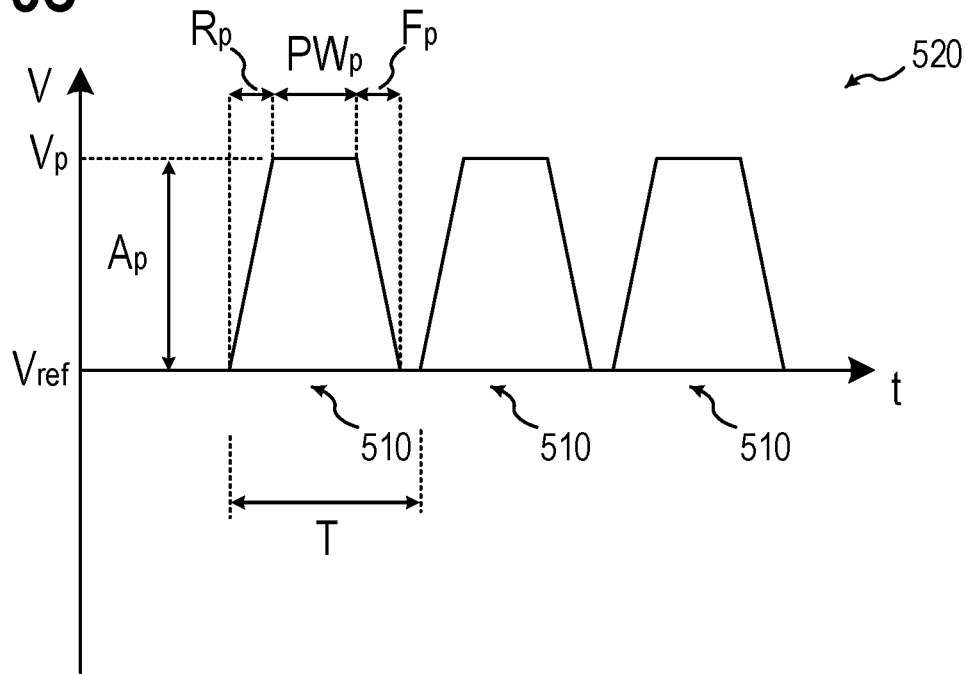
Figure 5D:
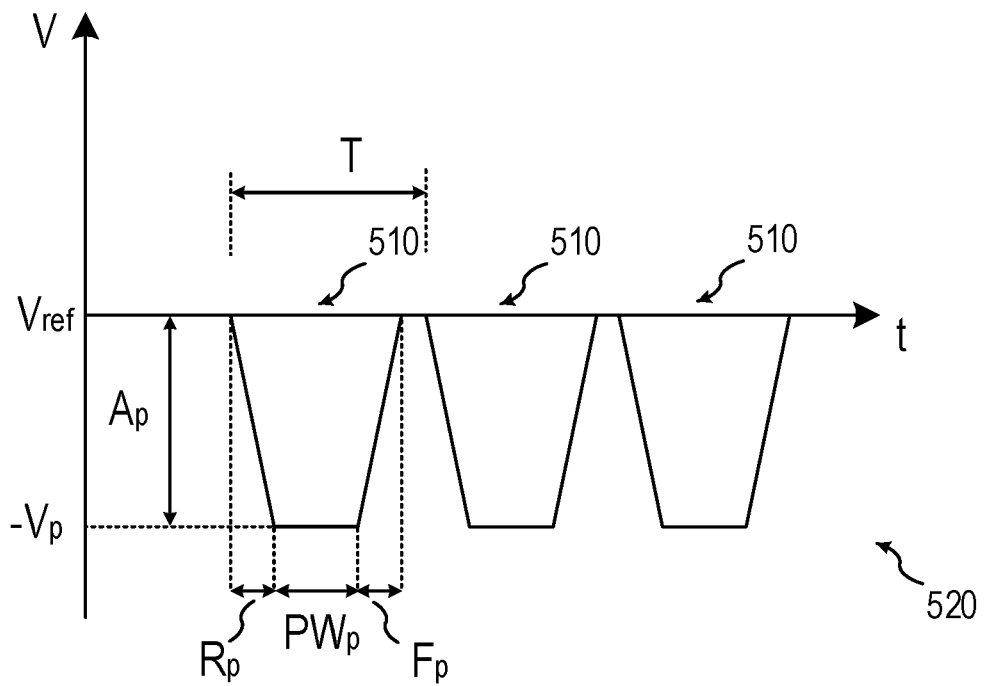
Figure 5E:
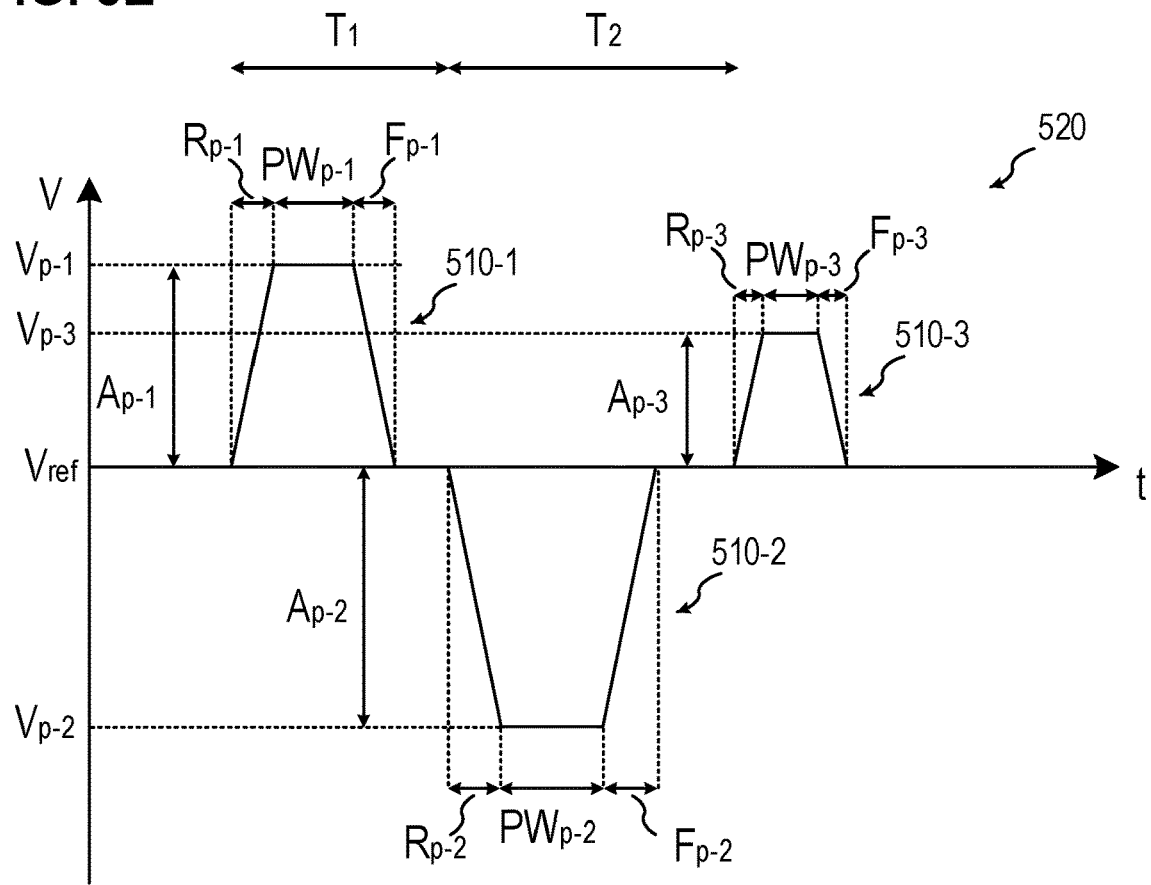

According to various aspects, the precondition signal 110p may include a sequence (also referred to as a train) 520 of precondition voltage pulses 510 (as shown for example in FIG. 5C, FIG. 5D, and FIG. 5E). In various aspects, the precondition signal 110p may include a plurality of precondition voltage pulses 510. Illustratively, the precondition voltage pulses 510 of the sequence 520 of precondition voltage pulses 510 may be supplied to a memory cell (e.g., a memory cell to be preconditioned) one after the other during a preconditioning of the memory cell. As numerical example, the sequence 520 of precondition voltage pulses 510 may include a number of precondition voltage pulses 510 in a range from 2 to 10000, for example in a range from 2 to 1000, for example in a range from 2 to 200, for example in a range from 5 to 100, for example in a range from 10 to 50.

According to various aspects, the sequence 520 of precondition voltage pulses 510 may include precondition voltage pulses 510 each having a same polarity, for example an amplitude, $A_p$, having the same sign (e.g., positive as shown for example in FIG. 5C, or negative as shown for example in FIG. 5D). According to various aspects, the sequence 520 of precondition voltage pulses 510 may include at least one precondition voltage pulse 510-1 having an amplitude, $A_p$, of opposite sign with respect to the amplitude, $A_p$, of another precondition voltage pulse 510-2 (as shown, for example, in FIG. 5E). In various aspects, the sequence 520 of precondition voltage pulses 510 may include at least one precondition voltage pulse 510-1 having opposite polarity with respect to another precondition voltage pulse 510-2.

According to various aspects, the polarity of the single precondition voltage pulse 510 (or the polarity of each precondition voltage pulse 510 of the sequence 520 of precondition voltage pulses 510) may be a function of the direction in which the polarization properties of the remanent-polarizable layer are to be shifted. The polarity of the voltage pulse may have opposite sign with respect to a shift (e.g., a positive or negative shift) that has occurred during or after a storage period. As an example, in the case that during a storage period the coercive fields of the remanent-polarizable layer shift towards more positive values (e.g., the actual value of a positive coercive field, $E_{C,IMP}^+$, may be higher with respect to the predefined value of the positive coercive field, $E_C^+$), the sign of the polarity of the precondition voltage pulse may be negative (e.g., opposite to the sign of the coercive field shift, $\Delta E_C$). As another example, in the case that during a storage period the coercive field of the remanent-polarizable layer shifts towards more positive values the sign of the polarity may be positive. In this configuration, knowledge of the memory state the memory cell is residing in may be beneficial for suitably configuring the polarity of the single precondition voltage pulse 510 (or the polarity of each precondition voltage pulse 510 of the sequence 520 of precondition voltage pulses 510). For example, a single precondition voltage pulse 510 or a sequence 520 of precondition voltage pulses 510 having each the same polarity may be applied at predetermined time intervals to a memory cell for restoring a predefined condition of the memory cell (e.g., without writing the memory cell and independent of any subsequent writing operation that may be performed or not).

According to various aspects, knowledge of the memory state the memory cell is residing in may not be required in the case that the precondition signal 110p includes at least a first precondition voltage pulse 510 of a first polarity and a second precondition voltage pulse 510 of a second polarity, opposite to the first polarity. In this configuration, the preconditioning operation may be independent from the memory state the memory cell is residing in, and also from the memory state to be written. In some aspects, the precondition sequence may end with a voltage pulse having a predefined polarity, either positive or negative. Therefore, it may happen that the memory state of the memory cell may be changed during such a precondition operation. However, the benefit may be that no knowledge about the initial memory state is needed.

As an example, the precondition signal (e.g., the precondition signal 110p) may include at least a first precondition voltage pulse 510 and a second precondition voltage pulse 510 applied at the gate node of the memory cell and a constant base voltage, $V_B$, applied at the source node or drain node of the memory cell. The first precondition voltage pulse 510 may have opposite polarity with respect to the second precondition voltage pulse 510. In this configuration, a first voltage drop and a second voltage drop may be generated over the remanent-polarizable layer of the memory cell (by applying the first and the second precondition voltage pulses 510). The first voltage drop may have opposite polarity with respect to the second voltage drop.

As another example, the precondition signal (e.g., the precondition signal 110p) may include at least a first precondition voltage pulse 510 and a second precondition voltage pulse 510 applied at the source node or drain node of the memory cell and a constant base voltage, $V_B$, applied at the gate node of the memory cell. The first precondition voltage pulse 510 may have opposite polarity with respect to the second precondition voltage pulse 510. Also in this configuration, a first voltage drop and a second voltage drop with opposite polarity may be generated over the remanent-polarizable layer of the memory cell.

However, it may also be possible to apply a time-varying precondition voltage (e.g., a sequence 520 of precondition voltage pulses 510) at both the gate node and the source node or drain node of the memory cell to generate the desired voltage drop over the remanent-polarizable layer of the memory cell (e.g., to generate a first voltage drop and a second voltage drop with opposite polarity).

According to various aspects, the precondition voltage pulses 510 of the sequence 520 of precondition voltage pulses 510 may all have substantially the same amplitude, $A_p$, (as shown, for example, in FIG. 5C and FIG. 5D). According to various aspects, at least one precondition voltage pulse 510-1 may have a different amplitude, $A_{p-1}$, (e.g., higher or lower, for example in terms of absolute value), with respect to another precondition voltage pulse 510-2 (as shown, for example, in FIG. 5E). In the exemplary case shown in FIG. 5E, a first precondition voltage pulse 510-1 may have a first amplitude, $A_{p-1}$, (e.g., associated with a first precondition voltage, $V_{p-1}$), which may be higher (e.g., greater in terms of absolute value) than a second amplitude, $A_{p-2}$, (e.g., associated with a second precondition voltage, $V_{p-2}$) of a second precondition voltage pulse 510-2. The first amplitude, $A_{p-1}$, may be higher (e.g., it may have a greater absolute value, for example it may be more negative) than a third amplitude, $A_{p-3}$, (e.g., associated with a third precondition voltage, $V_{p-3}$) of a third precondition voltage pulse 510-3.

According to various aspects, the precondition voltage pulses 510 of the sequence 520 of precondition voltage pulses 510 may all have substantially the same rise time, $R_p$, (as shown for example in FIG. 5C and FIG. 5D). According to various aspects, the precondition voltage pulses 510 of the sequence 520 of precondition voltage pulses 510 may all have substantially the same fall time, $F_p$, (as shown for example in FIG. 5C and FIG. 5D). According to various aspects, at least one precondition voltage pulse 510-1 of the sequence 520 of precondition voltage pulses 510 may have a different rise time, $R_{p-1}$, (e.g., longer or shorter), with respect to another precondition voltage pulse 510-2 (as shown, for example, in FIG. 5E). According to various aspects, at least one precondition voltage pulse 510-1 of the sequence 520 of precondition voltage pulses 510 may have a different fall time, $F_{p-1}$, (e.g., longer or shorter), with respect to another precondition voltage pulse 510-3 (as shown, for example, in FIG. 5E). In the exemplary case shown in FIG. 5E, a first precondition voltage pulse 510-1 may have a first rise time, $R_{p-1}$, which may be shorter than a second rise time, $R_{p-2}$ of second precondition voltage pulse 510-2 and may be longer than a third rise time, $R_{p-3}$, of a third precondition voltage pulse 510-3. The first precondition voltage pulse 510-1 may have a first fall time, $F_{p-1}$, which may be shorter than a second fall time, $F_{p-2}$, of the second precondition voltage pulse 510-2 and may be longer than a third fall time, $F_{p-3}$, of the third precondition voltage pulse 510-3.

According to various aspects, the precondition voltage pulses 510 of the sequence 520 of precondition voltage pulses 510 may all have substantially the same pulse width, $PW_p$, (as shown, for example, in FIG. 5C and FIG. 5D). According to various aspects, at least one precondition voltage pulse 510-1 may have a different pulse width, $PW_{p-1}$, (e.g., longer or shorter), with respect to another precondition voltage pulse 510-2 (as shown, for example, in FIG. 5E). In the exemplary case shown in FIG. 5E, a first precondition voltage pulse 510-1 may have a first pulse width, $PW_p$, which may be shorter (e.g., it may have a smaller value) than a second pulse width, $PW_{p-2}$, of a second precondition voltage pulse 510-2, and may be longer (e.g., it may have a greater value) than a third pulse width, $PW_{p-3}$, of a third precondition voltage pulse 510-3.

According to various aspects, the sequence 520 of precondition voltage pulses 510 may have a period, T. The period, T, may be or may represent a period of time between two neighboring precondition voltage pulses 510 in the sequence 520. As an example, the period, T, may be or may represent a period of time between the beginning of the rise time, $R_p$, of a first precondition voltage pulse 510, and the beginning of the rise time, $R_p$, of a second precondition voltage pulse 510, adjacent in the sequence 520 and subsequent to the first precondition voltage pulse 510. As a numerical example, the period, T, of the sequence 520 of precondition voltage pulses 510 may be in the range from about 20 ns to about 400 ns, for example from about 50 ns to about 200 ns. According to various aspects, the period, T, of the sequence 520 of precondition voltage pulses 510 may remain constant over time (as shown, for example in FIG. 5C and FIG. 5D). According to various aspects, the period, T, of the sequence 520 of precondition voltage pulses 510 may vary over time (as shown for example in FIG. 5E). As an example, in a first portion of the sequence 520 of precondition voltage pulses 510, the period may have a first value, $T_1$, and in a second portion of the sequence 520 the period may have a second value, $T_2$, different (e.g., longer or shorter) from the first value.

According to various aspects, the sequence 520 of precondition voltage pulses 510 may be configured such that a precondition voltage pulse 510 has opposite polarity with respect to the adjacent precondition voltage pulse(s) 510 in the sequence 520 (e.g., to its nearest neighboring precondition voltage pulse(s) 510 in the sequence 520). Illustratively, a precondition voltage pulse 510 having a positive amplitude may be followed by a precondition voltage pulse 510 having a negative amplitude, which may be followed by another precondition voltage pulse 510 having a positive amplitude, etc. According to various aspects, the sequence 520 of precondition voltage pulses 510 may be configured such that a first set (e.g., one or more) of precondition voltage pulses 510 all having the same polarity is followed by a second set (e.g., one or more) of precondition voltage pulses 510 all having opposite polarity with respect to the precondition voltage pulses 510 of the first set. In some aspects, the number of precondition voltage pulses 510 in the first set of precondition voltage pulses 510 may be the same as the number of precondition voltage pulses 510 in the second set of precondition voltage pulses 510. In other aspects, the number of precondition voltage pulses 510 in the first set of precondition voltage pulses 510 may be different from the number of precondition voltage pulses 510 in the second set.

Figure 5F:
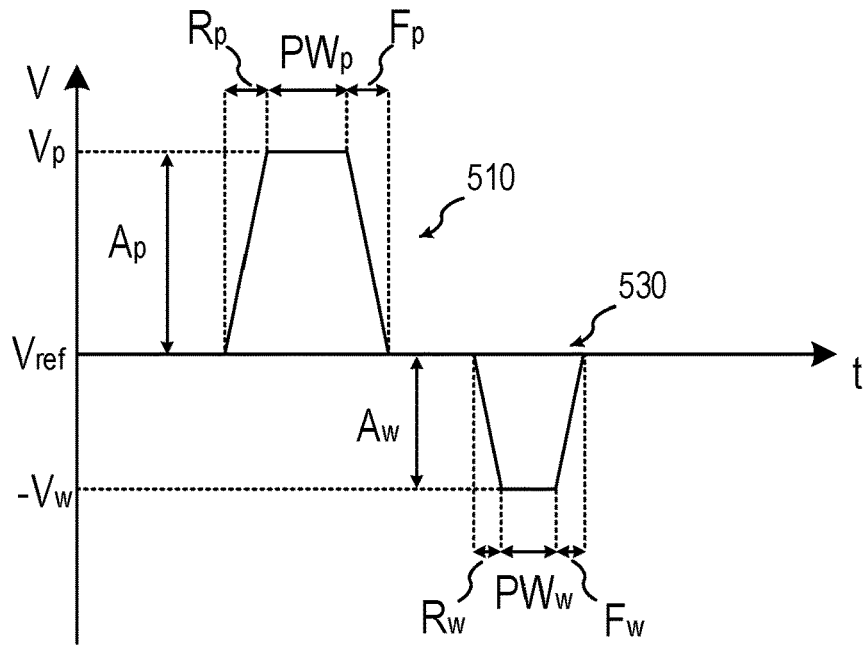

FIG. 5F shows a possible example for a precondition signal and a write signal to be supplied to a memory cell, according to various aspects. The precondition signal 110p may be according to any of the aspects described above in relation to FIG. 5A to FIG. 5D. The write signal may include any write voltage pulse 530 capable of writing a memory cell.

According to various aspects, a precondition voltage pulse 510 may be defined by the time dependence of a voltage drop over the remanent-polarizable layer of the memory cell (e.g., by the time dependence of the voltage drop between a gate node and a source node of the memory cell). The same may apply for a write voltage pulse 530.

According to various aspects, a write voltage pulse 530 may have an amplitude, A. The amplitude, $A_w$, may be or may represent the magnitude of a voltage level (e.g., a write voltage, $V_w$) associated with the write voltage pulse 530. As a numerical example, a write voltage pulse 530 may have an amplitude, $A_w$, having an absolute value in a range from about 500 mV to about 5 V, for example from about 1 V to about 3 V.

According to various aspects, a write voltage pulse 530 may have a rise time, $R_w$. As a numerical example, the rise time, $R_w$, may be in the range from about 1 ns to about 100 ns, for example from about 5 ns to about 50 ns. According to various aspects, a write voltage pulse 530 may have a fall time, $F_w$. As a numerical example, the fall time, $F_w$, may be in the range from about 1 ns to about 100 ns, for example from about 5 ns to about 50 ns. According to various aspects, a write voltage pulse 530 may have a pulse width, $PW_w$. As a numerical example, the write voltage pulse may have a pulse width, $PW_w$, in the range from about 1 μs to about 100 μs, for example from about 10 μs to about 50 μs. According to various aspects, a total duration of a write voltage pulse 530 may be determined by the pulse width, $PW_w$, the rise time, $R_w$, and the fall time, $F_w$, of the write voltage pulse 530.

According to various aspects, the write signal (e.g., the write signal 110w) may include a single write voltage pulse 530 (as shown for example in FIG. 5F). The write voltage pulse 530 may have a positive amplitude, $A_w$, or the write voltage pulse 530 may have a negative amplitude, $A_w$. According to various aspects, the rise time, $R_w$, and the fall time, $F_w$, of the write voltage pulse 530 may have substantially the same value. The rise time, $R_w$, and the fall time, $F_w$, may also have different values.

According to various aspects, the write signal (e.g., the write signal 110w) may include a sequence of write voltage pulses 530 (e.g., it may include a plurality of write voltage pulses 530). Illustratively, the write voltage pulses 530 of the sequence of write voltage pulses 530 may be supplied to a memory cell (e.g., a memory cell to be written) one after the other during a writing of the memory cell. As numerical example, the number of write voltage pulses 530 in the sequence of write voltage pulses 530 may be in a range from 1 to 100.

According to various aspects, the write voltage pulses of the sequence of write voltage pulses 530 may all have the same polarity (e.g., they may all have an amplitude, $A_w$, having the same sign). According to various aspects, the write voltage pulses 530 of the sequence of write voltage pulses 530 may all have substantially the same amplitude, $A_w$. According to various aspects, at least one write voltage pulse 530 of the sequence of write voltage pulses 530 may have a different amplitude, $A_w$, (e.g., higher or lower, for example in terms of absolute value), with respect to another write voltage pulse 530 of the sequence of write voltage pulses 530.

According to various aspects, the write voltage pulses 530 of the sequence of write voltage pulses 530 may all have substantially the same rise time, $R_w$. According to various aspects, the write voltage pulses 530 of the sequence of write voltage pulses 530 may all have substantially the same fall time, $F_w$. According to various aspects, at least one write voltage pulse 530 of the sequence of write voltage pulses 530 may have a different rise time, $R_w$, (e.g., longer or shorter), with respect to another write voltage pulse 530 of the sequence of write voltage pulses 530. According to various aspects, at least one write voltage pulse 530 of the sequence of write voltage pulses 530 may have a different fall time, $F_w$, (e.g., longer or shorter), with respect to another write voltage pulse 530 of the sequence of write voltage pulses. According to various aspects, the write voltage pulses 530 of the sequence of write voltage pulses 530 may all have substantially the same pulse width, $PW_w$. According to various aspects, at least one write voltage pulse 530 of the sequence of write voltage pulses 530 may have a different pulse width, $PW_w$, (e.g., longer or shorter), with respect to another write voltage pulse 530 of the sequence of write voltage pulses 530.

According to various aspects, the sequence of write voltage pulses 530 may have a period, T. As a numerical example, the period, T, of the sequence of write voltage pulses 530 may be in the range from about 5 ns to about 100 ns, for example from about 10 ns to about 50 ns. According to various aspects, the period, T, of the sequence of write voltage pulses 530 may remain constant over time. According to various aspects, the period, T, of the sequence of write voltage pulses 530 may vary over time.

The properties (e.g., the amplitude, A, the pulse width, PW, etc.) of the precondition voltage pulse(s) 510 and of the write voltage pulse(s) 530 may be selected such that a predefined condition of a memory cell may be restored by means of the precondition voltage pulse(s) 510 and a memory state of the memory cell may be switched by means of the write voltage pulse(s) 530. According to various aspects, the one or more write voltage pulses 530 may be configured such that a predefined condition of a memory cell is not restored by means of the one or more voltage pulses 530. In other words, the one or more write voltage pulses 530 may be configured to switch a memory state a memory cell is residing in, and may be configured not to shift other properties (e.g., an actual threshold voltage) of a memory cell. The one or more write voltage pulses 530 may be configured not to shift the properties (e.g., an actual coercive field, an actual residual polarization, etc.) of a remanent-polarizable layer (e.g., of a memory cell).

According to various aspects, a precondition voltage pulse 510 (e.g., at least one precondition voltage pulse 510 of one or more precondition voltage pulses 510, for example in a sequence 520 of precondition voltage pulses 510) may have a greater pulse width, $PW_p$, than a write voltage pulse 530 (e.g., than at least one of the one or more write voltage pulses 530). According to various aspects, a precondition voltage pulse 510 may have a greater amplitude, $A_p$, than a write voltage pulse 530 (e.g., an absolute value of the amplitude, $A_p$, of a precondition voltage pulse 510 may be greater than an absolute value of an amplitude, $A_w$, of a write voltage pulse 530). According to various aspects, a precondition voltage pulse 510 may have opposite polarity with respect a write voltage pulse 530. Alternatively, a precondition voltage pulse 510 may have same polarity with respect a write voltage pulse 530. As an example, a precondition voltage pulse 510 may have opposite polarity with respect a write voltage pulse 530 in the case that both the precondition voltage pulse 510 and the write voltage pulse 530 are supplied to a gate node of a memory cell (e.g., while supplying a base voltage, $V_B$, to a source/drain node of the memory cell). As another example, a precondition voltage pulse 510 may have same polarity with respect a write voltage pulse 530 in the case that the precondition voltage pulse 510 is supplied to a gate node of a memory cell (e.g., while supplying a base voltage, $V_B$, to a source/drain node of the memory cell) and the write voltage pulse 530 is supplied to a source/drain node of the memory cell (e.g., while supplying a base voltage, $V_B$, to a gate-node of the memory cell), or vice versa.

According to various aspects, a delay between the precondition voltage pulse 510 (or the last precondition voltage pulse 510 of a sequence 520 of precondition voltage pulses 510) and the write voltage pulse 530 (or the first write voltage pulse 530 in a sequence of write voltage pulses 530) may be in the range from about 1 ns to about 1 ms, for example in the range from about 100 ns and 500 µs.

According to various aspects, in the case that the precondition signal includes only a single precondition voltage pulse, the pulse width, $PW_p$, of this single precondition voltage pulse 510 may be greater than a pulse width, $PW_w$, or total pulse duration of one or more subsequent write voltage pulses 530. However, in the case that a plurality of precondition voltage pulses 510 is used, a total pulse duration of this plurality of precondition voltage pulses 510 may be greater than a pulse width, $PW_w$, or total pulse duration of one or more subsequent write voltage pulses 530. A total pulse duration may be described, for example, as the sum of the individual pulse widths of the one or more precondition/write voltage pulses, or, for example, as the sum of the individual pulse widths, the individual rise times, and the individual fall times of the one or more precondition/write voltage pulses 510.

However, in the case that a plurality of precondition voltage pulses 510 is used, each pulse width, $PW_p$, of these precondition voltage pulses 510 may be smaller than a pulse width, $PW_w$, or total pulse duration of one or more subsequent write voltage pulses 530.

According to various aspects, a pulse width or a total pulse duration of the one or more precondition voltage pulses 510 may be in the range from about 50 ns to about 100 ms, for example in the range from about 500 ns to about 1 ms, for example in the range from about 1 us to about 500 µs. According to various aspects, a pulse width or a total pulse duration of the one or more write voltage pulses 530 may be in the range from about 5 ns to about 10 ms, for example from about 100 ns to about 1 µs.

FIGS. 5A to 5E show exemplary voltage pulses included in the precondition signal. The total time length of the precondition signal may be defined by the period, T, of the pulses and the number of the pulses. It may be understood that also an AC-voltage or any other suitable time variable voltage may be applied to precondition the memory cell.

According to various aspects, the predefined condition of a memory cell may be obtained by applying the precondition signal 110p as described herein. As an example, 100 or 1000 cycles of precondition voltage pulses 510 having alternating polarities may bring a memory cell in the predefined condition associated with the memory cell.

Figure 6:
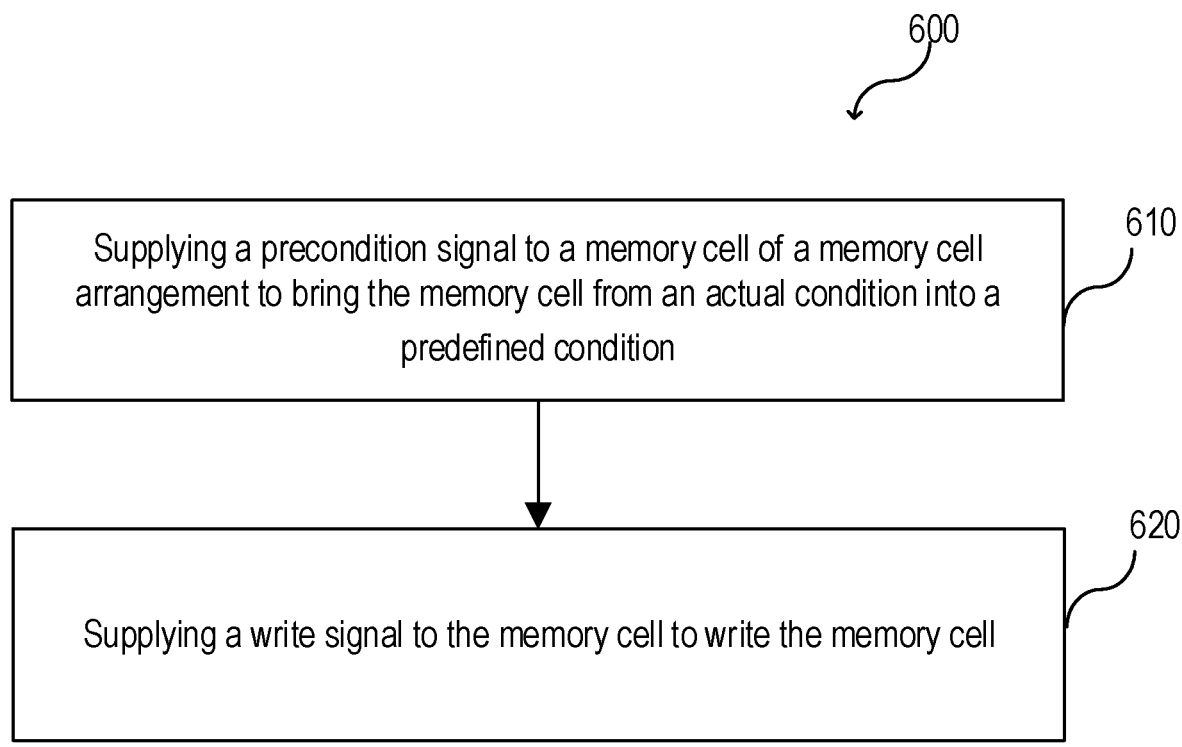
FIG. 6 shows a schematic flow diagram of a method for operating a memory cell arrangement, according to various aspects.

FIG. 6 shows a schematic flow diagram of a method 600, e.g. a method for operating a memory cell arrangement 100, according to various aspects. The method 600 may include in 610 supplying a precondition signal to a memory cell 102pw of the memory cell arrangement 100. The precondition signal 110p may be configured to precondition the memory cell 102pw (e.g., to restore a predefined condition of the memory cell 102pw). According to various aspects, the precondition signal 110p may be configured to bring the memory cell from an actual condition into a predefined condition. The method 600 may also include supplying a write signal to the memory cell 102pw. As an example, the write signal may be supplied after the precondition signal has been supplied to the memory cell 102pw. The write signal may be configured to write the at least one memory cell.

Figure 7:
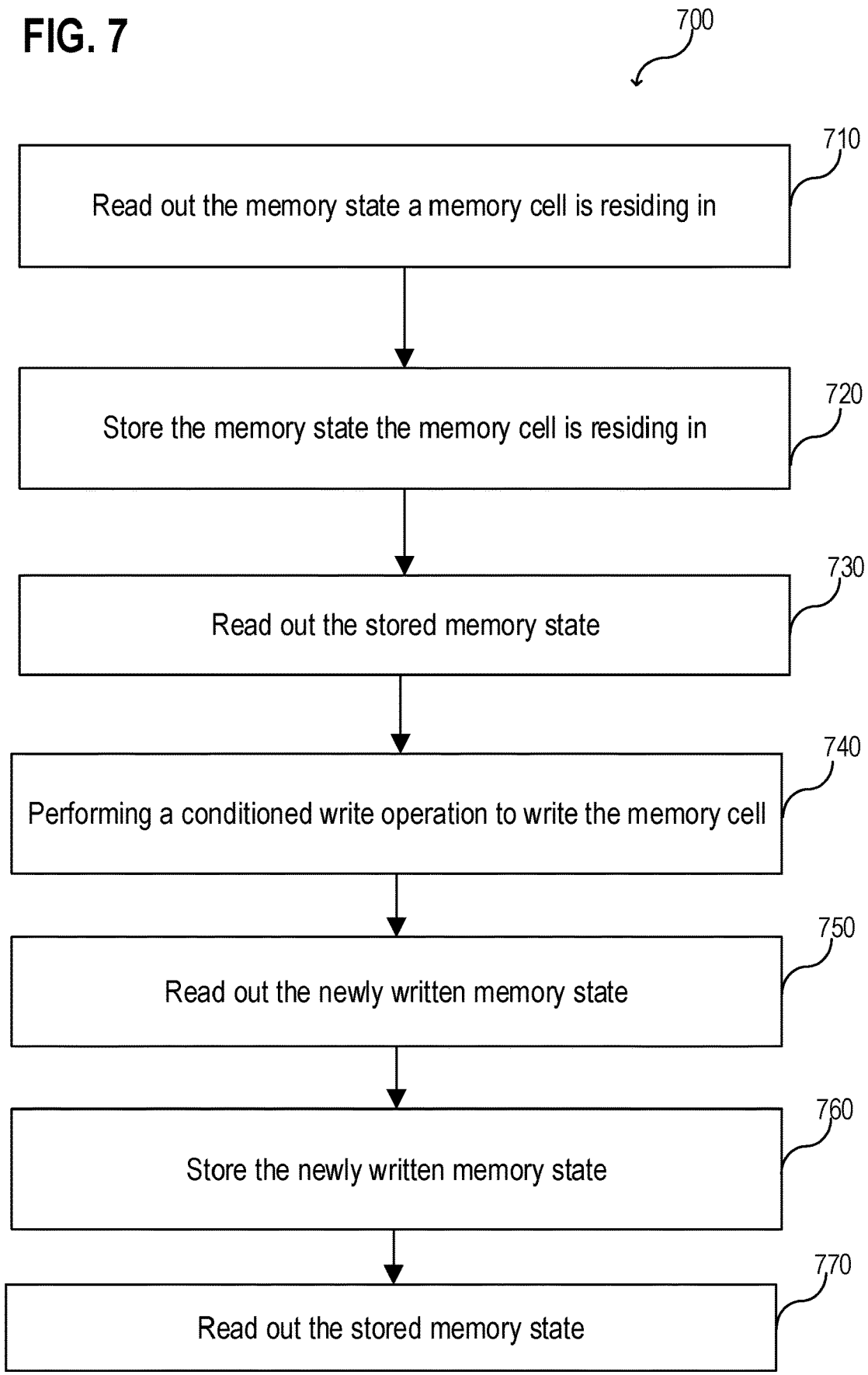
FIG. 7 shows a schematic flow diagram of a method for operating a memory cell arrangement, according to various aspects.

FIG. 7 shows a schematic flow diagram of a method 700, e.g. a method for operating a memory cell arrangement 100, according to various aspects. The method 700 may include in 710 reading out (in other words, determining) the memory state a memory cell 102pw of the memory cell arrangement 100 is residing in. The memory cell 102pw may be configured to reside in one memory state of at least two memory states associated with the memory cell 102pw. The method may include in 720 storing (in other words, retaining) the memory state the memory cell 102pw is residing in for a certain period of time. Illustratively, the memory state may be retained for a period of time that may lead to a change of the memory properties of the memory cell 102pw, for example due to imprint related effects. The method 700 may include in 730 reading out the memory state the memory cell 102pw is residing in. The method 700 may include in 740 performing a conditioned write operation on the memory cell 102pw. According to various aspects, the conditioned write operation may include supplying a precondition signal 110p to the memory cell 102pw to restore a predefined condition of the memory cell 102pw (e.g., to substantially remove an imprint of the memory cell 102pw). The conditioned write operation may also include supplying a write signal 110w to the memory cell 102pw to write the memory cell 102pw. The method 700 may include in 750 reading out the memory state the memory cell 102pw is residing in. According to various aspects, the conditioned write operation may ensure that the readout in 750 of the newly written memory state of the memory cell 102pw does not cause a read fail, illustratively, it may ensure that the newly written memory state is correctly determined during readout. The method may include in 760 storing (in other words, retaining) the newly written memory state the memory cell 102pw is residing in for a certain period of time. The method 700 may include in 770 reading out the stored memory state the memory cell 102pw is residing in. According to various aspects, the conditioned write operation may ensure that the readout in 770 of stored memory state the memory cell 102 is residing in does not cause a read fail (e.g., it may ensure that the newly written memory state is correctly determined).

In the following, various examples are provided that may include one or more aspects described above with reference to the memory cell arrangement 100, the method 600, and the method 700. It may be intended that aspects described in relation to the memory arrangement 100 may apply also to the method 600 and/or the method 700, and vice versa.

Example 1 is a memory cell arrangement including: a control circuit configured to supply a precondition signal and a write signal to a memory cell of the memory cell arrangement, wherein the precondition signal is configured to bring the memory cell from an actual condition into a predefined condition, and wherein the write signal is configured to write the memory cell. The memory cell may be a non-volatile memory cell, for example the non-volatile memory cell may include a remanent polarizable layer and a field-effect transistor structure. The predefined condition may be associated with a predefined threshold voltage of the field-effect transistor structure of the non-volatile memory cell.

In example 2, the memory cell arrangement of example 1 may optionally further include that writing the memory cell includes bringing the memory cell from one of at least two memory states into another one of the at least two memory states of the memory cell.

In example 3, the memory cell arrangement of example 1 or 2 may optionally further include that the predefined condition is associated with one or more predefined electronic properties of the memory cell.

In example 4, the memory cell arrangement of any one of examples 1 to 3 may optionally further include that the predefined condition includes a first predefined threshold voltage or a second predefined threshold voltage, the first predefined threshold voltage is associated with a first memory state of the memory cell and the second predefined threshold voltage is associated with a second memory state of the memory cell.

In example 5, the memory cell arrangement of any one of examples 1 to 4 may optionally further include that predefined condition includes a predefined position of a memory window, and wherein the precondition signal is configured to shift an actual voltage position of the memory window associated with the memory cell towards the predefined position.

In example 6, the memory cell arrangement of any one of examples 1 to 5 may optionally further include that bringing the memory cell from an actual condition into a predefined condition includes: bringing the memory cell into a (e.g. first or second) predefined condition such that, after writing the memory cell into a second memory state, the memory cell is in a second predefined condition; and/or bringing the memory cell into a (e.g. first or second) predefined condition such that, after writing the memory cell into a first memory state, the memory cell is in a first predefined condition.

In example 7, the memory cell arrangement of any one of examples 1 to 6 may optionally further include that the memory cell includes a remanent polarizable layer.

In example 8, the memory cell arrangement of example 6 and 7 may optionally further include that the first predefined condition is a first predefined polarization state of the remanent polarizable layer of the memory cell, and that the second predefined condition is a second predefined polarization state of the remanent polarizable layer of the memory cell.

In example 9, the memory cell arrangement according to example 8 may optionally further include that an absolute value of a first coercive field of the remanent polarizable layer associated with the first predefined polarization state is substantially equal to an absolute value of a second coercive field of the remanent polarizable layer associated with the second predefined polarization state.

In example 10, the memory cell arrangement of example 8 or 9 may optionally further include that an absolute value of a first residual polarization of the remanent polarizable layer associated with the first predefined polarization state is substantially equal to an absolute value of a second residual polarization of the remanent polarizable layer associated with the second predefined polarization state.

In example 11, the memory cell arrangement of example 9 may optionally further include that the precondition signal is configured to modify the remanent polarizable layer such that an actual value of the first and/or second coercive field of the remanent polarizable layer of the memory cell is shifted to a predefined value associated with the respective coercive field.

In example 12, the memory cell arrangement of example 10 may optionally further include that the precondition signal is configured to modify the remanent polarizable layer such that an actual value of the first and/or second residual polarization of the remanent polarizable layer of the memory cell is shifted to a predefined value associated with the respective residual polarization.

In example 13, the memory cell arrangement of any of the examples 1 to 12 may optionally further include that the memory cell includes a field-effect transistor structure, and that the precondition signal includes one or more precondition voltage pulses to shift a first threshold voltage and a second threshold voltage associated with the field-effect transistor structure of the memory cell.

In example 14, the memory cell arrangement of example 13 may optionally further include that the precondition signal is configured to modify the field-effect transistor structure such that an actual value of the first and/or second threshold voltage of the field-effect transistor structure of the memory cell is shifted to a predefined value associated with the respective threshold voltage (or at least towards the predefined value associated with the respective threshold voltage).

In example 15, the memory cell arrangement of example 7 and 13 or of example 7 and 14 may optionally further include that the first threshold voltage is a function of a first residual polarization of the remanent polarizable layer, and that the second threshold voltage is a function of a second residual polarization of the remanent polarizable layer. The first threshold voltage may be a function of a first coercive field of the remanent polarizable layer, and the second threshold voltage may be a function of a second coercive field of the remanent polarizable layer.

In example 16, the memory cell arrangement of any one of the examples 1 to 15 may optionally further include that the precondition signal includes one or more precondition voltage pulses, and that the write signal includes one or more write voltage pulses.

In example 17, the memory cell arrangement of example 16 may optionally further include that at least one of the one or more precondition voltage pulses has opposite polarity with respect to at least one of the one or more write voltage pulses.

In example 18, the memory cell arrangement of example 16 or 17 may optionally further include that at least one of the one or more precondition voltage pulses has a greater pulse width and/or a greater amplitude than at least one of the one or more write voltage pulses.

In example 19, the memory cell arrangement of any one of the examples 16 to 18 may optionally further include that at least one of the one or more precondition voltage pulses includes a pulse height having an absolute value in the range from about 1 V to about 10 V.

In example 20, the memory cell arrangement of any one of the examples 16 to 19 may optionally further include that at least one of the one or more precondition voltage pulses includes a pulse width in the range from about 100 ns to about 2 ms.

In example 21, the memory cell arrangement of any one of the examples 16 to 20 may optionally further include that at least one of the one or more precondition voltage pulses includes a rise time in the range from about 1 ns to about 100 ns.

In example 22, the memory cell arrangement of any one of the examples 16 to 21 may optionally further include that at least one of the one or more precondition voltage pulses includes a fall time in the range from about 1 ns to about 100 ns.

In example 23, the memory cell arrangement of any one of the examples 16 to 22 may optionally further include that at least one of the one or more write voltage pulses includes a pulse height having an absolute value in the range from about 500 mV to about 5 V.

In example 24, the memory cell arrangement of any one of the examples 16 to 21 may optionally further include that at least one of the one or more precondition voltage pulses includes a pulse width in the range from about 1 µs to about 100 µs.

In example 25, the memory cell arrangement of any one of the examples 16 to 24 may optionally further include that the one or more precondition voltage pulses are supplied as a sequence of precondition voltage pulses including a number of precondition voltage pulses in the range from 2 to 10000, for example in the range from 2 to 200.

In example 26, the memory cell arrangement of example 25 may optionally further include that the voltage pulses of the sequence of precondition voltage pulses are provided with a pulse period in the range from about 10 ns to about 400 ns.

Example 27 is a memory cell arrangement including: a control circuit configured to supply a precondition signal and a write signal to a memory cell of the memory cell arrangement, the memory cell includes a field-effect transistor structure and a remanent polarizable layer, wherein the precondition signal is configured to bring the memory cell from an actual condition into a predefined condition, wherein the predefined condition is associated with a predefined threshold voltage of the field-effect transistor structure of the memory cell, and wherein the write signal is configured to write the memory cell. In example 27, the memory cell may be a volatile memory cell (for example as part of a random access memory (RAM), e.g., of a ferroelectric random access memory (FeRAM), or it may be a non-volatile memory cell.

In example 28, the memory cell arrangement of example 27 may optionally further include that writing the memory cell includes bringing the memory cell from one of at least two memory states into another one of the at least two memory states of the memory cell.

In example 29, the memory cell arrangement of example 27 or 28 may optionally further include that the predefined condition is associated with a predefined position of a memory window, and wherein the precondition signal is configured to shift an actual voltage position of the memory window associated with the memory cell to the predefined position.

In example 30, the memory cell arrangement of any one of examples 27 to 29 may optionally further include that bringing the memory cell from an actual condition into a predefined condition includes: bringing the memory cell into a (e.g. first or second) predefined condition such that, after writing the memory cell into a second memory state, the memory cell is in a second predefined condition associated with a second predefined threshold voltage; and/or bringing the memory cell into a (e.g. first or second) predefined condition such that, after writing the memory cell into a first memory state, the memory cell is in a first predefined condition associated with a first predefined threshold voltage.

In example 31, the memory cell arrangement of example 30 may optionally further include that the first predefined condition is a first predefined polarization state of the remanent polarizable layer of the memory cell, and that the second predefined condition is a second predefined polarization state of the remanent polarizable layer of the memory cell.

In example 32, the memory cell arrangement of example 31 may optionally further include that an absolute value of a first coercive field of the remanent polarizable layer associated with the first predefined polarization state is substantially equal to an absolute value of a second coercive field of the remanent polarizable layer associated with the second predefined polarization state.

In example 33, the memory cell arrangement of example 32 may optionally further include that the precondition signal is configured to modify the remanent polarizable layer such that an actual value of the first and/or second coercive field of the remanent polarizable layer of the memory cell is shifted to a predefined value associated with the respective coercive field.

In example 34, the memory cell arrangement of example 32 or 33 may optionally further include that the precondition signal is configured to modify the remanent polarizable layer such that, after the precondition signal is applied, an absolute value of the first coercive field is substantially equal to an absolute value of the second coercive field.

In example 35, the memory cell arrangement of any one of examples 31 to 34 may optionally further include that an absolute value of a first residual polarization of the remanent polarizable layer associated with the first predefined polarization state is substantially equal to an absolute value of a second residual polarization of the remanent polarizable layer associated with the second predefined polarization state.

In example 36, the memory cell arrangement of example 35 may optionally further include that the precondition signal is configured to modify the remanent polarizable layer such that, after the precondition signal is applied, an absolute value of the first residual polarization is substantially equal to an absolute value of the second residual polarization.

In example 37, the memory cell arrangement of example 35 or 36 may optionally further include that the precondition signal is configured to modify the remanent polarizable layer such that an actual value of the first and/or second residual polarization of the remanent polarizable layer of the memory cell is shifted to a predefined value associated with the respective residual polarization.

In example 38, the memory cell arrangement of any one of the examples 27 to 37 may optionally further include that the precondition signal includes one or more precondition voltage pulses to shift an actual threshold voltage of the field-effect transistor structure to a predefined threshold voltage.

In example 39, the memory cell arrangement of any one of the examples 27 to 38 may optionally further include that the threshold voltage is a function of a residual polarization of the remanent polarizable layer.

In example 40 the memory cell arrangement of any one of the examples 27 to 39 may optionally further include that the memory cell is a non-volatile memory cell.

In example 41, the memory cell arrangement of any one of the examples 27 to 40 may optionally further include that the precondition signal includes one or more precondition voltage pulses, and that the write signal includes one or more write voltage pulses.

In example 42, the memory cell arrangement of example 41 may optionally further include that at least one of the one or more precondition voltage pulses has opposite polarity with respect to at least one of the one or more write voltage pulses.

In example 43, the memory cell arrangement of example 41 or 42 may optionally further include that at least one of the one or more precondition voltage pulses has a greater pulse width and/or a greater amplitude than at least one of the one or more write voltage pulses.

In example 44, the memory cell arrangement of any one of the examples 41 to 43 may optionally further include that at least one of the one or more precondition voltage pulses includes a pulse height having an absolute value in the range from about 1 V to about 10 V.

In example 45, the memory cell arrangement of any one of the examples 41 to 44 may optionally further include that at least one of the one or more precondition voltage pulses includes a pulse width in the range from about 100 ns to about 2 ms.

In example 46, the memory cell arrangement of any one of the examples 41 to 45 may optionally further include that at least one of the one or more precondition voltage pulses includes a rise time in the range from about 1 ns to about 100 ns.

In example 47, the memory cell arrangement of any one of the examples 41 to 46 may optionally further include that at least one of the one or more precondition voltage pulses includes a fall time in the range from about 1 ns to about 100 ns.

In example 48, the memory cell arrangement of any one of the examples 41 to 47 may optionally further include that at least one of the one or more write voltage pulses includes a pulse height having an absolute value in the range from about 500 mV to about 5 V.

In example 49, the memory cell arrangement of any one of the examples 41 to 48 may optionally further include that at least one of the one or more precondition voltage pulses includes a pulse width in the range from about 1 µs to about 100 µs.

In example 50, the memory cell arrangement of any one of the examples 41 to 49 may optionally further include that the one or more precondition voltage pulses are supplied as a sequence of precondition voltage pulses including a number of precondition voltage pulses in the range from 1 to 200.

In example 51, the memory cell arrangement of example 50 may optionally further include that the voltage pulses of the sequence of precondition voltage pulses are provided with a pulse period in the range from about 10 ns to about 400 ns.

Example 52 is a memory cell arrangement including: a control circuit configured to supply a precondition signal and a write signal to a non-volatile memory cell of the memory cell arrangement, the non-volatile memory cell including a field-effect transistor structure, wherein the precondition signal is configured to bring the non-volatile memory cell from an actual condition into a predefined condition, the predefined condition is associated with a predefined threshold voltage of the field-effect transistor structure of the non-volatile memory cell, and wherein the write signal is configured to write the memory cell.

Example 53 is a method for operating a memory cell arrangement, the method including: supplying a precondition signal to a non-volatile memory cell of the memory cell arrangement, the non-volatile memory cell including a field-effect transistor structure, wherein the precondition signal is configured to bring the non-volatile memory cell from an actual condition into a predefined condition, wherein the predefined condition is associated with a predefined threshold voltage of the field-effect transistor structure of the non-volatile memory cell; and supplying a write signal to the non-volatile memory cell of the memory cell arrangement, wherein the write signal is configured to write the memory cell.

Example 54 is a method for writing a ferroelectric field-effect transistor based memory cell, the method including: applying a conditioned write signal to the ferroelectric field-effect transistor based memory cell to write the ferroelectric field-effect transistor based memory cell and at the same time compensate an imprint-effect of one or more ferroelectric layers of the ferroelectric field-effect transistor based memory cell. The conditioned write signal may be configured as described with respect to the precondition signal and the write signal of the preceding examples.

Example 55 is a method for conditioning a ferroelectric layer structure, the method including: applying a conditioning signal to the ferroelectric layer structure (e.g., via two electrodes contacting opposite sides of the ferroelectric layer structure) to compensate an imprint-effect of one or more ferroelectric layers of the ferroelectric layer structure. The conditioning signal may be configured as described with respect to the precondition signal.

Example 56 is a method for writing a ferroelectric field-effect transistor based memory cell, the method including: applying a conditioned write signal to the ferroelectric field-effect transistor based memory cell to write the ferroelectric field-effect transistor based memory cell, the conditioned write signal is configured to supply at least a first voltage pulse and a second voltage pulse to the ferroelectric field-effect transistor based memory cell, the first voltage pulse is configured to cause a first voltage drop over one or more ferroelectric layers of the ferroelectric field-effect transistor based memory cell and the second voltage pulse is configured to cause a second voltage drop over the one or more ferroelectric layers of the ferroelectric field-effect transistor based memory cell, the first voltage drop and the second voltage drop having opposite polarities with respect to one another and/or the first voltage drop and the second voltage drop having different pulse heights with respect to one another and/or the first voltage drop and the second voltage drop having different pulse durations with respect to one another. The at least two voltage pulses may be configured as described with respect to the voltage pulses of the precondition signal and the write signal of the preceding examples, respectively.

In Example 57, the method of example 56 may optionally further include that the second voltage pulse is supplied after the first voltage pulse.

Example 58 is a memory cell arrangement including: a control circuit configured to supply a conditioned write signal to a ferroelectric field-effect transistor based memory cell of the memory cell arrangement, the memory cell includes one or more ferroelectric layers, wherein the conditioned write signal is configured to write the ferroelectric field-effect transistor based memory cell and at the same time to compensate an imprint related effect of the one or more ferroelectric layers of the ferroelectric field-effect transistor based memory cell. The conditioned write signal may be configured as described with respect to the precondition signal and the write signal of the preceding examples.

Example 59 is a memory cell arrangement including: a control circuit configured to supply a conditioned write signal to a ferroelectric field-effect transistor based memory cell of the memory cell arrangement to write the ferroelectric field-effect transistor based memory cell, the memory cell includes one or more ferroelectric layers, wherein the conditioned write signal includes at least a first voltage pulse and a second voltage pulse, wherein the control circuit is configured to supply the first voltage pulse and the second voltage pulse to the ferroelectric field-effect transistor based memory cell, wherein the first voltage pulse is configured to cause a first voltage drop over the one or more ferroelectric layers of the ferroelectric field-effect transistor based memory cell, wherein the second voltage pulse is configured to cause a second voltage drop over the one or more ferroelectric layers of the ferroelectric field-effect transistor based memory cell, the first voltage drop and the second voltage drop having opposite polarities with respect to one another and/or the first voltage drop and the second voltage drop having different pulse heights with respect to one another and/or the first voltage drop and the second voltage drop having different pulse durations with respect to one another. The first voltage pulse and the second voltage pulse may be configured as described with respect to the voltage pulses of the preconditions signal and the write signal of the preceding examples, respectively.

Example 60 is a memory cell arrangement including: a ferroelectric layer structure and a control circuit configured to conditioning the ferroelectric layer structure, the control circuit is configured to supply a conditioning signal to the ferroelectric layer structure (e.g., via two electrodes contacting opposite sides of the ferroelectric layer structure) to compensate an imprint-effect of one or more ferroelectric layers of the ferroelectric layer structure. The conditioning signal may be configured as described with respect to the precondition signal.

Example 61 is a memory cell arrangement including: a control circuit configured to supply a precondition signal and a write signal to a memory cell of the memory cell arrangement, the memory cell includes a capacitor structure including a remanent polarizable layer, wherein the precondition signal is configured to bring the memory cell from an actual condition into a predefined condition, wherein the predefined condition is associated with a predefined amount of charge stored in the capacitor structure of the memory cell, and wherein the write signal is configured to write the memory cell.

Example 62 is a capacitor arrangement including: a control circuit configured to supply a precondition signal to a capacitor structure of the capacitor arrangement, the capacitor structure including a remanent polarizable layer, wherein the precondition signal is configured to bring the capacitor structure (or the remanent polarizable layer of the capacitor structure) from an actual condition into a predefined condition, wherein the predefined condition is associated with a predefined amount of charge stored in the capacitor structure.

The memory cell arrangement of example 61 or the capacitor arrangement of example 62 may further include a field-effect transistor structure. The gate of the field-effect transistor structure may be electrically connected to an electrode of the capacitor structure.

In example 63, the memory cell arrangement of example 61 or the capacitor arrangement of example 62 may include one or more or all of the features of the memory arrangement described herein, e.g., with reference to examples 1 to 52 in the case the features could be implemented in the memory cell arrangement of example 61 or the capacitor arrangement of example 62 accordingly.

In some aspects, the write signal may be for selectively writing the memory cell into one of at least two memory states. Illustratively, the write signal may selectively be one of at least two write signals, e.g. one of a first write signal configured to write the memory cell into a first memory state or a second write signal configured to write the memory cell into a second memory state. Thus, in some aspects, a memory cell arrangement may include a control circuit configured to supply a precondition signal and one of at least two write signals to a memory cell of the memory cell arrangement, the memory cell including a field-effect transistor structure and a remanent polarizable layer, wherein the precondition signal is configured to bring the memory cell from an actual condition into a predefined condition, wherein the predefined condition is associated with a predefined threshold voltage of the field-effect transistor structure of the memory cell, and wherein the at least two write signals are configured to write the memory cell selectively into a first memory state or into a second memory state.

In some aspects, the control circuit may be configured to write the memory cell into the first memory state by a first write operation, the first write operation including supplying the precondition signal and a first write signal of the at least two write signals to the memory cell; and the control circuit may be configured to write the memory cell into the second memory state by a second write operation, the second write operation including supplying the precondition signal or a further precondition signal and a second write signal of the at least two write signals to the memory cell. In other aspects, the control circuit may be configured to write the memory cell into the first memory state by a first write operation independently from whether the memory cell is in the first memory state or second memory state, the first write operation including supplying the precondition signal and a first write signal of the at least two write signals to the memory cell; and the control circuit may be configured to write the memory cell into the second memory state by a second write operation independently from whether the memory cell is in the first memory state or second memory state, the second write operation including supplying the precondition signal or a further precondition signal and a second write signal of the at least two write signals to the memory cell.

In some aspects, the memory cell arrangement may include a control circuit configured to supply a precondition signal and a write signal to a memory cell of the memory cell arrangement, the memory cell including a field-effect transistor structure, wherein the precondition signal is configured to bring the memory cell from an actual condition into a predefined condition, wherein the predefined condition is associated with a predefined threshold voltage of the field-effect transistor structure of the memory cell, and wherein the write signal is configured to write the memory cell selectively into a first memory state or into a second memory state.

The precondition signal may include one or more precondition voltage pulses and the write signal may include one or more write voltage pulses, and at least one precondition voltage pulse of the one or more precondition voltage pulses is different from at least one write voltage pulse of the one or more write voltage pulses in at least one of pulse amplitude, pulse width, and/or polarity.

In some aspects, the method for operating a memory cell arrangement may include: supplying a write signal to one or more memory cells of the memory cell arrangement, wherein the write signal is configured to write the one or more memory cells selectively into a first memory state or second memory sate; and, associated with the supplying of the write signal (illustratively, along with the supplying of the write signal), supplying a precondition signal to the one or more memory cells of the memory cell arrangement prior to the supplying of the write signal, wherein the precondition signal is configured to bring each of the one or more memory cells from an actual condition into a predefined condition, wherein the predefined condition is associated with a predefined threshold voltage of a field-effect transistor structure of the respective memory cell of the one or more memory cells.

In some aspects, the precondition signal and the write signal (e.g., one of at least two write signals) may be logically associated with one another. Illustratively, the precondition signal and the write signal may be part of a common operation to write a memory cell into one of the at least two memory states (e.g., into the LVT state or into the HVT state, e.g. into a logic 0 or into a logic 1). Further illustratively, in some aspects, the precondition signal and the write signal may not be supplied individually to a memory cell, but only in combination with one another.

In some aspects, the operation including the supplying precondition signal and the write signal may be carried out for each writing of a memory cell (e.g., writing into the LVT state or into the HVT state, e.g. writing into a logic 0 or into a logic 1), or at least for the majority of the writing operations on a memory cell (e.g., more than 50% of the writing operations on a memory cell). Illustratively, each precondition signal may be followed by a write signal associated therewith, and each write signal may be preceded by a precondition signal associated therewith. In some aspects, each precondition signal may be followed by an associated write signal with a predefined time period between the precondition signal and the associated write signal (e.g., less than 5 s, less than 1 s, or less than 500 ms), e.g. the write signal may be supplied within a predefined time period after the associated precondition signal (e.g., less than 5 s, less than 1 s, or less than 500 ms). In some aspects, each write signal may be preceded by an associated precondition signal with a predefined time period between the write signal and the associated precondition signal (e.g., less than 5 s, less than 1 s, or less than 500 ms), e.g. the precondition signal may be supplied within a predefined time period before the associated write signal (e.g., less than 5 s, less than 1 s, or less than 500 ms).

In one or more of the preceding examples, the precondition signal may be configured such that the actual value of the first and/or second coercive field of the remanent polarizable layer may be shifted by more than 25%, for example more than 50%, for example more than 100%, towards the respective predefined value by applying the precondition signal.

In one or more of the preceding examples, the precondition signal may be configured such that after the precondition signal has been applied a difference between the actual value of the first and/or second coercive field of the remanent polarizable layer and the respective predefined value may be less than 100% of the predefined value, for example less than 50%, for example less than 25%.

In one or more of the preceding examples, the precondition signal may be configured such that the actual value of the first and/or second residual polarization of the remanent polarizable layer may be shifted by more than 25%, for example more than 50%, for example more than 100%, towards the respective predefined value by applying the precondition signal.

In one or more of the preceding examples, the precondition signal may be configured such that after the precondition signal has been applied a difference between the actual value of the first and/or second residual polarization of the remanent polarizable layer and the respective predefined value may be less than 100% of the predefined value, for example less than 50%, for example less than 25%.

In one or more of the preceding examples, the precondition signal may be configured such that the actual value of the first threshold voltage and the actual value of the second threshold voltage may be shifted by more than 25%, for example more than 50%, for example more than 100%, towards the respective predefined value by applying the precondition signal.

In one or more of the preceding examples, the precondition signal may be configured such that the actual value of the first threshold voltage and the actual value of the second threshold voltage may be shifted by more than 250 mV, for example more than 500 mV, for example more than 750 mV, towards the respective predefined value by applying the precondition signal.

In one or more of the preceding examples, the precondition signal may be configured such that after the precondition signal has been applied a difference between the actual value of the (e.g. first and/or second) threshold voltage and the respective predefined absolute value may be less than 100% of the predefined value, for example less than 50%, for example less than 25%.

In one or more of the preceding examples, the precondition signal may be configured such that after the precondition signal has been applied a difference between the actual value of the (e.g. first and/or second) threshold voltage and the respective predefined absolute value may be less than 500 mV, for example less than 250 mV.

In one or more of the preceding examples, the sign of a polarity of each of the one or more precondition voltage pulses may be opposite to the sign of a difference between an actual value of the (e.g. first or second) coercive field of a remanent polarizable layer of the memory cell and the respective predefined value.

In one or more of the preceding examples, a pulse width or total pulse duration of the one or more precondition voltage pulses may be substantially equal to or greater than a pulse width or total pulse duration of the one or more write voltage pulses.

It is noted that one or more functions described herein with reference to a memory cell, a remanent polarizable layer, a memory cell arrangement, etc. may be accordingly part of a method, e.g. part of a method for operating a memory cell arrangement. Vice versa, one or more functions described herein with reference to a method, e.g. with reference to a method for operating a memory cell arrangement, may be implemented accordingly in a device or in a part of a device, for example, in a remanent polarizable layer, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. Memory cell arrangement comprising:
a control circuit configured to supply a precondition signal and one of at least two write signals to a memory cell of the memory cell arrangement, the memory cell comprising a field-effect transistor structure and a remanent-polarizable layer,
wherein the precondition signal is configured to bring the memory cell from an actual condition into a predefined condition, wherein the predefined condition is associated with a predefined threshold voltage of the field-effect transistor structure of the memory cell, and
wherein the at least two write signals are configured to write the memory cell selectively into a first memory state or into a second memory state.

2. The memory cell arrangement according to claim 1,
wherein the control circuit is configured to write the memory cell into the first memory state by a first write operation, the first write operation comprising supplying the precondition signal and a first write signal of the at least two write signals to the memory cell; and
wherein the control circuit is configured to write the memory cell into the second memory state by a second write operation, the second write operation comprising supplying the precondition signal or a further precondition signal and a second write signal of the at least two write signals to the memory cell.

3. The memory cell arrangement according to claim 1,
wherein the predefined condition is associated with a predefined position of a memory window, and wherein the precondition signal is configured to shift an actual voltage position of the memory window associated with the memory cell towards the predefined position.

4. The memory cell arrangement according to claim 1,
wherein the control circuit is configured to:
bring the memory cell into a predefined condition such that, after writing the memory cell into a second memory state, the memory cell is in a second predefined condition associated with a second predefined threshold voltage; and/or
bring the memory cell into a predefined condition such that, after writing the memory cell into a first memory state, the memory cell is in a first predefined condition associated with a first predefined threshold voltage.

5. The memory cell arrangement according to claim 4,
wherein the first predefined condition is a first predefined polarization state of the remanent polarizable layer of the memory cell, and
wherein the second predefined condition is a second predefined polarization state of the remanent polarizable layer of the memory cell.

6. The memory cell arrangement according to claim 1,
wherein the precondition signal is configured to generate one or more precondition voltage pulses to shift an actual threshold voltage of the field-effect transistor structure to or at least towards a predefined threshold voltage.

7. The memory cell arrangement according to claim 6,
wherein the precondition signal is configured such that after the precondition signal has been applied a difference between the actual threshold voltage and the predefined threshold voltage is less than 100% of the predefined threshold voltage.

8. The memory cell arrangement according to claim 6,
wherein the precondition signal is configured such that after the precondition signal has been applied a difference between the actual threshold voltage and the predefined threshold voltage is less than 500 mV.

9. The memory cell arrangement according to claim 1,
wherein the precondition signal comprises one or more precondition voltage pulses, and
wherein the write signal comprises one or more write voltage pulses.

10. The memory cell arrangement according to claim 9,
wherein the precondition signal comprises at least a first precondition voltage pulse and at least a second precondition voltage pulse, wherein the first precondition voltage pulse has opposite polarity with respect to the second precondition voltage pulse.

11. The memory cell arrangement according to claim 9,
wherein the precondition signal comprises a first precondition signal portion configured to generate a voltage drop over the remanent-polarizable layer with a first polarity and a second precondition signal portion configured to generate a voltage drop over the remanent-polarizable layer with a second polarity opposite the first polarity.

12. The memory cell arrangement according to claim 9,
wherein a sum of the respective pulse width of the one or more precondition voltage pulses is greater than a sum of the respective pulse width of the one or more write voltage pulses.

13. The memory cell arrangement according to claim 9,
wherein at least one of the one or more precondition voltage pulses comprises a pulse height having an absolute value in the range from about 0.5 V to about 25 V, and/or a pulse width in the range from about 0.5 ns to about 2 ms, and/or a rise time in the range from about 0.1 ns to about 100 ns, and/or a fall time in the range from about 0.1 ns to about 100 ns.

14. The memory cell arrangement according to claim 9,
wherein at least one of the one or more write voltage pulses comprises a pulse height having an absolute value in the range from about 500 mV to about 25 V and/or,
wherein a sum of the pulse widths of the one or more write voltage pulses is in the range from about 5 ns to about 10 ms.

15. The memory cell arrangement according to claim 9,
wherein the one or more precondition voltage pulses are supplied as a sequence of precondition voltage pulses comprising a number of precondition voltage pulses in the range from 2 to 10000.

16. The memory cell arrangement according to claim 15,
wherein the voltage pulses of the sequence of precondition voltage pulses are provided with a pulse period in the range from about 1 ns to about 1 ms.

17. Memory cell arrangement comprising:
a control circuit configured to supply a precondition signal and a write signal to a non-volatile memory cell of the memory cell arrangement, the non-volatile memory cell comprising a field-effect transistor structure,
wherein the precondition signal is configured to bring the non-volatile memory cell from an actual condition into a predefined condition, wherein the predefined condition is associated with a predefined threshold voltage of the field-effect transistor structure of the non-volatile memory cell, and wherein the write signal is configured to write the memory cell selectively into a first memory state or into a second memory state.

18. The memory cell arrangement according to claim 17,
wherein the precondition signal comprises one or more precondition voltage pulses and the write signal comprises one or more write voltage pulses, and
wherein at least one precondition voltage pulse of the one or more precondition voltage pulses is different from at least one write voltage pulse of the one or more write voltage pulses in at least one of pulse amplitude, pulse width, and/or polarity.

19. Method for operating a memory cell arrangement, the method comprising:
supplying a write signal to one or more memory cells of the memory cell arrangement, wherein the write signal is configured to write the one or more memory cells selectively into a first memory state or second memory sate; and,
associated with the supplying of the write signal, supplying a precondition signal to the one or more memory cells of the memory cell arrangement prior to the supplying of the write signal,
wherein the precondition signal is configured to bring each of the one or more memory cells from an actual condition into a predefined condition, and wherein the predefined condition is associated with a predefined threshold voltage of a field-effect transistor structure of the respective memory cell of the one or more memory cells.

20. The method according to claim 19,
wherein the precondition signal comprises one or more precondition voltage pulses and the write signal comprises one or more write voltage pulses, and
wherein at least one precondition voltage pulse of the one or more precondition voltage pulses is different from at least one write voltage pulse of the one or more write voltage pulses in at least one of pulse amplitude, pulse width, and/or polarity.

* * * * *